United States Patent
Dueck et al.

(10) Patent No.: US 6,418,398 B1
(45) Date of Patent: Jul. 9, 2002

(54) OPTIMIZATION WITH RUIN RECREATE

(75) Inventors: Gunter Dueck, Neckargemünd; Martin Maehler, Heidelberg; Johannes Schneider, Straubing; Gerhard Schrimpf, Hosenfeld; Hermann Stamm-Wilbrandt, Neckarsteinach, all of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/410,450

(22) Filed: Oct. 1, 1999

(30) Foreign Application Priority Data

Oct. 1, 1998 (EP) .............................. 98118593

(51) Int. Cl.[7] ......................... G06F 15/00; G06F 17/18; G06F 101/14
(52) U.S. Cl. ........................... 702/181; 705/7
(58) Field of Search ................. 702/182, 181, 702/189; 705/7, 8; 717/9; 706/12, 13, 20, 45, 14; 701/23, 209, 25, 210

(56) References Cited

U.S. PATENT DOCUMENTS

| | | | |
|---|---|---|---|
| 4,947,350 A | * | 8/1990 | Murray et al. .............. 702/181 |
| 5,107,452 A | * | 4/1992 | Karmarkar et al. .......... 708/607 |
| 5,794,224 A | * | 8/1998 | Yufik ........................... 706/14 |
| 5,850,617 A | * | 12/1998 | Libby .......................... 701/202 |
| 5,897,629 A | * | 4/1999 | Shinagawa et al. ............ 706/3 |
| 5,913,199 A | * | 6/1999 | Dueck et al. .................. 705/7 |
| 6,052,678 A | * | 4/2000 | Itoh et al. ..................... 706/13 |
| 6,289,507 B1 | * | 8/2001 | Tanaka et al. ................. 717/9 |

\* cited by examiner

*Primary Examiner*—Marc S. Hoff
*Assistant Examiner*—Demetrius Pretlow
(74) *Attorney, Agent, or Firm*—Ronald L. Drumheller

(57) ABSTRACT

The present invention relates to an automatic method of computerized optimization of a technical system like for instance routing systems such as a transportation routing system or a communication network.

The invention teaches an optimization method of a technical system comprising new ruin- and recreate-steps operating on the state-variables of a current system state. The ruin-step destroys the current state in a "larger" extend and thus introduces increased freedom for the recreate-step to create a new state. This allows for recalculating a new state in accordance with additional constraints which also improves a quality measure of the state; i.e. every recalculated state always fulfills the additional constraints. Moreover, the recreate-step is not guided by the values of said destroyed state variables, which opens a larger space for determining a new state.

12 Claims, 20 Drawing Sheets

| Problem instance | Best solution previous to Rochat et al. | | | Best R&R solution | | Problem instance | Best solution by Rochat et al. | | Best R&R solution | |
|---|---|---|---|---|---|---|---|---|---|---|
| | $n_T$ | $l$ | | $n_T$ | $l$ | | $n_T$ | $l$ | $n_T$ | $l$ |
| R101 | 18 | 1607.7* | [7] | 19 | 1645.7* | R101 | 19 | 1650.80 | 19 | 1650.80 |
| R102 | 17 | 1434.0* | [7] | 17 | 1481.2* | R102 | 17 | 1486.12 | 17 | 1486.12 |
| R103 | 13 | 1207 | [9] | 13 | 1296.19 | R103 | 14 | 1213.62 | 13 | 1296.19 |
| R104 | 10 | 1048 | [9] | 10 | 981.23 | R104 | 10 | 982.01 | 10 | 981.23 |
| R105 | 14 | 1420.94 | [10] | 14 | 1377.11 | R105 | 14 | 1377.11 | 14 | 1377.11 |
| R106 | 12 | 1350 | [9] | 12 | 1252.03 | R106 | 12 | 1252.03 | 12 | 1252.03 |
| R107 | 11 | 1146 | [9] | 10 | 1119.93 | R107 | 10 | 1159.86 | 10 | 1119.93 |
| R108 | 10 | 989 | [9] | 9 | 966.40 | R108 | 9 | 980.95 | 9 | 966.40 |
| R109 | 12 | 1205 | [10] | 11 | 1210.66 | R109 | 11 | 1235.68 | 11 | 1210.66 |
| R110 | 11 | 1105 | [9] | 10 | 1121.46 | R110 | 10 | 1080.36 | 10 | 1121.46 |
| R111 | 10 | 1151 | [9] | 10 | 1122.76 | R111 | 10 | 1129.88 | 10 | 1122.76 |
| R112 | 10 | 992 | [9] | 10 | 953.63 | R112 | 10 | 953.63 | 10 | 953.63 |
| C101 | 10 | 827.3* | [7] | 10 | 827.3* | C101 | 10 | 828.94 | 10 | 828.94 |
| C102 | 10 | 827.3* | [7] | 10 | 827.3* | C102 | 10 | 828.94 | 10 | 828.94 |
| C103 | 10 | 835 | [9] | 10 | 828.06 | C103 | 10 | 828.06 | 10 | 828.06 |
| C104 | 10 | 840 | [9] | 10 | 824.78 | C104 | 10 | 824.78 | 10 | 824.78 |
| C105 | 10 | 828.94 | [10] | 10 | 828.94 | C105 | 10 | 828.94 | 10 | 828.94 |
| C106 | 10 | 827.3* | [7] | 10 | 827.3* | C106 | 10 | 828.94 | 10 | 828.94 |
| C107 | 10 | 827.3* | [7] | 10 | 827.3* | C107 | 10 | 828.94 | 10 | 828.94 |
| C108 | 10 | 827.3* | [7] | 10 | 827.3* | C108 | 10 | 828.94 | 10 | 828.94 |
| C109 | 10 | 828.94 | [10] | 10 | 828.94 | C109 | 10 | 828.94 | 10 | 828.94 |
| RC101 | 14 | 1669 | [9] | 15 | 1623.58 | RC101 | 15 | 1623.58 | 15 | 1623.58 |
| RC102 | 13 | 1557 | [9] | 13 | 1477.54 | RC102 | 13 | 1477.54 | 13 | 1477.54 |
| RC103 | 11 | 1110 | [9] | 11 | 1261.67 | RC103 | 11 | 1262.02 | 11 | 1261.67 |
| RC104 | 10 | 1204.07 | [10] | 10 | 1135.52 | RC104 | 10 | 1135.83 | 10 | 1135.52 |
| RC105 | 14 | 1602 | [9] | 13 | 1633.72 | RC105 | 13 | 1733.56 | 13 | 1633.72 |
| RC106 | 12 | 1485.67 | [10] | 12 | 1384.26 | RC106 | 12 | 1384.92 | 12 | 1384.26 |
| RC107 | 11 | 1274.71 | [10] | 11 | 1230.54 | RC107 | 11 | 1230.95 | 11 | 1230.54 |
| RC108 | 10 | 1281 | [9] | 10 | 1147.26 | RC108 | 10 | 1170.70 | 10 | 1147.26 |

Fig. 3

| Problem instance | Best solution previous to Rochat et al. | | | Best R&R solution | | Problem instance | Best solution by Rochat et al. | | Best R&R solution | |
|---|---|---|---|---|---|---|---|---|---|---|
| | $n_T$ | $l$ | | $n_T$ | $l$ | | $n_T$ | $l$ | $n_T$ | $l$ |
| R201 | 4 | 1354 | [9] | 4 | 1265.74 | R201 | 4 | 1281.58 | 4 | 1265.74 |
| R202 | 3 | 1530.49 | [10] | 3 | 1195.30 | R202 | 4 | 1088.07 | 3 | 1195.30 |
| R203 | 3 | 1126 | [9] | 3 | 947.63 | R203 | 3 | 948.74 | 3 | 947.63 |
| R204 | 2 | 914 | [13] | 2 | 848.91 | R204 | 2 | 869.29 | 2 | 848.91 |
| R205 | 3 | 1128 | [9] | 3 | 1053.37 | R205 | 3 | 1063.24 | 3 | 1053.37 |
| R206 | 3 | 833 | [9] | 3 | 906.14 | R206 | 3 | 912.97 | 3 | 906.14 |
| R207 | 3 | 904 | [9] | 3 | 811.51 | R207 | 3 | 814.78 | 3 | 811.51 |
| R208 | 2 | 759.21 | [10] | 2 | 726.82 | R208 | 2 | 738.60 | 2 | 726.82 |
| R209 | 2 | 855 | [9] | 3 | 915.16 | R209 | 3 | 944.64 | 3 | 915.16 |
| R210 | 3 | 1052 | [9] | 3 | 963.67 | R210 | 3 | 967.50 | 3 | 963.67 |
| R211 | 3 | 816 | [9] | 2 | 904.32 | R211 | 2 | 949.50 | 2 | 904.32 |
| C201 | 3 | 591.56 | [10] | 3 | 591.56 | C201 | 3 | 591.56 | 3 | 591.56 |
| C202 | 3 | 591.56 | [10] | 3 | 591.56 | C202 | 3 | 591.56 | 3 | 591.56 |
| C203 | 3 | 591.55 | [10] | 3 | 591.17 | C203 | 3 | 591.17 | 3 | 591.17 |
| C204 | 3 | 590.60 | [10] | 3 | 590.60 | C204 | 3 | 590.60 | 3 | 590.60 |
| C205 | 3 | 588.88 | [10] | 3 | 588.88 | C205 | 3 | 588.88 | 3 | 588.88 |
| C206 | 3 | 588.49 | [10] | 3 | 588.49 | C206 | 3 | 588.49 | 3 | 588.49 |
| C207 | 3 | 588.32 | [10] | 3 | 588.29 | C207 | 3 | 588.29 | 3 | 588.29 |
| C208 | 3 | 588.49 | [10] | 3 | 588.32 | C208 | 3 | 588.32 | 3 | 588.32 |
| RC201 | 4 | 1249 | [9] | 4 | 1415.33 | RC201 | 4 | 1438.89 | 4 | 1415.33 |
| RC202 | 4 | 1221 | [9] | 4 | 1162.80 | RC202 | 4 | 1165.57 | 4 | 1162.80 |
| RC203 | 3 | 1203 | [9] | 3 | 1051.82 | RC203 | 3 | 1079.57 | 3 | 1051.82 |
| RC204 | 3 | 897 | [9] | 3 | 798.46 | RC204 | 3 | 806.75 | 3 | 798.46 |
| RC205 | 4 | 1389 | [9] | 4 | 1318.09 | RC205 | 4 | 1333.71 | 4 | 1318.09 |
| RC206 | 3 | 1213 | [9] | 3 | 1152.03 | RC206 | 3 | 1212.64 | 3 | 1152.03 |
| RC207 | 3 | 1181 | [9] | 3 | 1068.86 | RC207 | 3 | 1085.61 | 3 | 1068.86 |
| RC208 | 3 | 919 | [9] | 3 | 829.69 | RC208 | 3 | 833.97 | 3 | 829.69 |

Fig. 4

| instance | $n_C$ | sequence | $l$ | $l_{tot}$ |
|---|---|---|---|---|
| R107 | 9 | 28-50-76-40-53-68-29-24-80 | 115.86 | 119 |
| | 9 | 33-81-65-71-9-66-20-51-1 | 128.77 | 142 |
| | 9 | 48-47-36-64-49-19-82-18-89 | 126.00 | 167 |
| | 9 | 12-54-39-23-67-55-4-25-26 | 132.61 | 166 |
| | 12 | 2-57-43-15-41-22-75-56-74-72-73-21 | 103.08 | 129 |
| | 9 | 27-69-30-79-78-34-35-3-77 | 111.35 | 118 |
| | 11 | 60-83-45-46-8-84-5-17-61-85-93 | 113.47 | 151 |
| | 11 | 52-7-11-62-88-31-10-63-90-32-70 | 116.34 | 138 |
| | 12 | 95-97-42-14-44-38-86-16-91-100-37-98 | 105.74 | 181 |
| | 9 | 94-96-92-59-99-6-87-13-58 | 66.70 | 147 |
| R202 | 37 | 96-59-92-98-85-91-14-42-2-21-72-39-23-15-38-44-16-61-99-18-8-84-86-5-6-94-95-97-43-74-13-37-100-93-17-60-89 | 392.26 | 560 |
| | 29 | 50-33-65-34-29-3-28-27-69-76-67-73-40-53-87-57-41-22-75-56-4-54-55-25-24-80-12-26-58 | 354.70 | 376 |
| | 34 | 83-45-48-47-36-63-64-11-19-62-88-30-71-78-79-81-9-51-90-49-46-82-7-10-20-32-66-35-68-77-1-70-31-52 | 448.34 | 522 |
| RC105 | 8 | 72-71-81-41-54-96-94-93 | 127.54 | 120 |
| | 8 | 92-95-62-67-84-51-85-89 | 141.21 | 96 |
| | 8 | 82-12-11-87-59-97-75-58 | 137.55 | 172 |
| | 5 | 90-53-66-56-91 | 74.54 | 59 |
| | 8 | 65-83-64-99-52-86-57-74 | 116.71 | 124 |
| | 7 | 2-45-5-7-79-55-68 | 108.97 | 147 |
| | 9 | 98-14-47-15-16-9-10-13-17 | 121.02 | 149 |
| | 9 | 42-61-8-6-46-4-3-1-100 | 144.53 | 132 |
| | 7 | 63-23-19-22-49-20-77 | 160.78 | 143 |
| | 5 | 69-88-78-73-60 | 81.70 | 95 |
| | 9 | 39-36-44-38-40-37-35-43-70 | 132.62 | 183 |
| | 10 | 31-29-27-30-28-26-32-34-50-80 | 134.62 | 183 |
| | 7 | 33-76-18-48-21-25-24 | 151.62 | 111 |
| RC206 | 33 | 69-98-2-45-5-44-42-39-38-36-40-41-61-88-53-78-73-79-7-6-8-46-4-3-1-43-35-37-54-96-93-91-80 | 334.39 | 592 |
| | 34 | 65-83-82-11-14-12-47-15-16-75-59-52-99-64-84-67-71-94-81-90-66-56-50-34-32-26-89-20-24-48-25-77-58-74 | 475.23 | 554 |
| | 33 | 72-92-95-62-31-29-27-28-30-33-63-85-51-76-18-21-23-19-49-22-57-86-87-97-9-10-13-17-60-55-100-70-68 | 342.42 | 578 |

Fig. 5

| problem instance | best known | | R&R | | | | |
|---|---|---|---|---|---|---|---|
| | $n_T$ | $l_{min}$ | $\rho$ | $l_{min}$ | $\langle l \rangle$ | $l_{max}$ | $\sigma_l$ |
| R107 | 10 | 1159.86 | 0.24 | 1119.93 | 1125.84 | 1136.05 | 5.33 |
| R202 | 3 | 1530.49 | 0.64 | 1195.30 | 1243.43 | 1316.48 | 30.73 |
| RC105 | 13 | 1733.56 | 0.12 | 1633.72 | 1646.77 | 1663.03 | 12.18 |
| RC206 | 3 | 1212.64 | 1.00 | 1152.03 | 1198.54 | 1256.62 | 29.84 |

Fig. 6

| node | $x$ | $y$ | $S$ | $D$ | $C$ | $r_{ord}$ | $r_{alt}$ |
|---|---|---|---|---|---|---|---|
| 1 | 715 | 488 | 1 | - | - | - | - |
| 2 | 200 | 450 | 1 | 32 | 1 | 2-1 | 2-6-10-1 |
| 3 | 771 | 47 | 0 | 32 | 1 | 3-1 | 3-4-1 |
| 4 | 818 | 214 | 1 | 64 | 1 | 4-10-1 | 4-1 |
| 5 | 833 | 511 | 1 | 96 | 1 | 5-1 | 5-14-8-1 |
| 6 | 320 | 205 | 1 | 32 | 1 | 6-10-1 | 6-13-2-1 |
| 7 | 982 | 401 | 0 | 64 | 1 | 7-5-1 | 7-4-1 |
| 8 | 626 | 872 | 1 | 96 | 1 | 8-1 | 8-14-5-1 |
| 9 | 385 | 613 | 1 | 32 | 1 | 9-1 | 9-12-2-1 |
| 10 | 587 | 265 | 1 | 64 | 1 | 10-1 | 10-6-2-1 |
| 11 | 858 | 789 | 0 | 64 | 1 | 11-1 | 11-14-5-1 |
| 12 | 64 | 494 | 1 | 32 | 1 | 12-9-1 | 12-2-1 |
| 13 | 77 | 68 | 1 | 96 | 1 | 13-6-10-1 | 13-2-1 |
| 14 | 746 | 878 | 1 | 64 | 1 | 14-1 | 14-5-1 |
| 15 | 125 | 260 | 0 | 96 | 1 | 15-6-10-1 | 15-2-1 |

Fig. 9

| link | $b_{ord}$ | $b_{alt}$ | $b_t$ | costs |
|---|---|---|---|---|
| 1-2 | 32 | 288 | 2000 | 1551 |
| 1-3 | 32 | 0 | 64 | 445 |
| 1-4 | 0 | 64 | 64 | 293 |
| 1-5 | 160 | 96 | 2000 | 363 |
| 1-8 | 96 | 96 | 2000 | 1185 |
| 1-9 | 64 | 0 | 64 | 353 |
| 1-10 | 352 | 32 | 2000 | 774 |
| 1-11 | 64 | 0 | 64 | 334 |
| 1-14 | 64 | 0 | 64 | 392 |
| 2-6 | 0 | 64 | 64 | 273 |
| 2-12 | 0 | 64 | 64 | 143 |
| 2-13 | 0 | 128 | 128 | 804 |
| 2-15 | 0 | 96 | 128 | 410 |
| 3-4 | 0 | 32 | 64 | 174 |
| 4-7 | 0 | 64 | 64 | 249 |
| 4-10 | 64 | 0 | 64 | 237 |
| 5-7 | 64 | 0 | 64 | 186 |
| 5-14 | 0 | 96 | 128 | 756 |
| 6-10 | 224 | 64 | 2000 | 822 |
| 6-13 | 96 | 32 | 128 | 558 |
| 6-15 | 96 | 0 | 128 | 406 |
| 8-14 | 0 | 96 | 128 | 242 |
| 9-12 | 32 | 32 | 64 | 343 |
| 11-14 | 0 | 64 | 64 | 144 |

Fig. 10

| node | $x$ | $y$ | $S$ | $D$ | $C$ | $r_{ord}$ | $r_{alt}$ |
|---|---|---|---|---|---|---|---|
| 1 | 715 | 488 | 1 | - | - | - | - |
| 2 | 200 | 450 | 1 | 32 | 1 | 2-36-31-1 | 2-32-28-1 |
| 3 | 771 | 47 | 0 | 32 | 1 | 3-19-1 | 3-10-1 |
| 4 | 818 | 214 | 1 | 64 | 1 | 4-19-1 | 4-34-1 |
| 5 | 833 | 511 | 1 | 96 | 1 | 5-1 | 5-20-16-1 |
| 6 | 320 | 205 | 1 | 32 | 1 | 6-36-28-1 | 6-40-10-1 |
| 7 | 982 | 401 | 0 | 64 | 1 | 7-19-1 | 7-5-1 |
| 8 | 626 | 872 | 1 | 96 | 1 | 8-16-1 | 8-38-31-1 |
| 9 | 385 | 613 | 1 | 32 | 1 | 9-31-1 | 9-21-28-1 |
| 10 | 587 | 265 | 1 | 64 | 1 | 10-25-31-1 | 10-1 |
| 11 | 858 | 789 | 0 | 64 | 1 | 11-20-16-1 | 11-5-1 |
| 12 | 64 | 494 | 1 | 32 | 1 | 12-42-28-1 | 12-39-31-1 |
| 13 | 77 | 68 | 1 | 96 | 1 | 13-36-31-1 | 13-28-1 |
| 14 | 746 | 878 | 1 | 64 | 1 | 14-8-16-1 | 14-20-5-1 |
| 15 | 125 | 260 | 0 | 96 | 1 | 15-28-1 | 15-36-31-1 |
| 16 | 715 | 688 | 1 | - | - | - | - |
| 17 | 200 | 650 | 1 | 32 | 16 | 17-24-8-16 | 17-39-31-16 |
| 18 | 771 | 247 | 0 | 32 | 16 | 18-19-1-16 | 18-5-20-16 |
| 19 | 818 | 414 | 1 | 64 | 16 | 19-1-16 | 19-25-31-16 |
| 20 | 833 | 711 | 1 | 96 | 16 | 20-16 | 20-5-1-16 |
| 21 | 320 | 405 | 1 | 32 | 16 | 21-28-1-16 | 21-9-31-16 |
| 22 | 982 | 601 | 0 | 64 | 16 | 22-5-1-16 | 22-20-16 |
| 23 | 626 | 1072 | 1 | 96 | 16 | 23-8-16 | 23-38-31-16 |
| 24 | 385 | 813 | 1 | 32 | 16 | 24-8-16 | 24-38-31-16 |
| 25 | 587 | 465 | 1 | 64 | 16 | 25-31-16 | 25-19-1-16 |
| 26 | 858 | 989 | 0 | 64 | 16 | 26-8-16 | 26-20-16 |
| 27 | 64 | 694 | 1 | 32 | 16 | 27-38-8-16 | 27-39-31-16 |
| 28 | 77 | 268 | 1 | 96 | 16 | 28-1-16 | 28-36-31-16 |
| 29 | 746 | 1078 | 1 | 64 | 16 | 29-16 | 29-14-20-16 |
| 30 | 125 | 460 | 0 | 96 | 16 | 30-28-1-16 | 30-36-31-16 |
| 31 | 515 | 488 | 1 | - | - | - | - |
| 32 | 0 | 450 | 1 | 32 | 31 | 32-2-36-31 | 32-28-1-31 |
| 33 | 571 | 47 | 0 | 32 | 31 | 33-6-36-31 | 33-34-1-31 |
| 34 | 618 | 214 | 1 | 64 | 31 | 34-25-31 | 34-1-31 |
| 35 | 633 | 511 | 1 | 96 | 31 | 35-25-31 | 35-1-31 |
| 36 | 120 | 205 | 1 | 32 | 31 | 36-31 | 36-28-1-31 |
| 37 | 782 | 401 | 0 | 64 | 31 | 37-19-1-31 | 37-25-31 |
| 38 | 426 | 872 | 1 | 96 | 31 | 38-31 | 38-8-16-31 |
| 39 | 185 | 613 | 1 | 32 | 31 | 39-27-38-31 | 39-31 |
| 40 | 387 | 265 | 1 | 64 | 31 | 40-31 | 40-10-1-31 |
| 41 | 658 | 789 | 0 | 64 | 31 | 41-8-16-31 | 41-38-31 |
| 42 | -136 | 494 | 1 | 32 | 31 | 42-28-1-31 | 42-12-39-31 |
| 43 | -123 | 68 | 1 | 96 | 31 | 43-13-36-31 | 43-28-1-31 |
| 44 | 546 | 878 | 1 | 64 | 31 | 44-8-16-31 | 44-38-31 |
| 45 | -75 | 260 | 0 | 96 | 31 | 45-28-1-31 | 45-36-31 |

Fig. 11

| link | $b_{ord}$ | $b_{alt}$ | $b_t$ | costs | link | $b_{ord}$ | $b_{alt}$ | $b_t$ | costs |
|---|---|---|---|---|---|---|---|---|---|
| 1-5 | 160 | 160 | 2000 | 363 | 13-43 | 96 | 0 | 128 | 400 |
| 1-10 | 0 | 64 | 64 | 258 | 14-20 | 0 | 64 | 64 | 189 |
| 1-16 | 608 | 96 | 2000 | 600 | 14-29 | 0 | 64 | 64 | 200 |
| 1-19 | 320 | 64 | 2000 | 381 | 15-28 | 96 | 0 | 128 | 98 |
| 1-28 | 512 | 288 | 2000 | 2025 | 15-36 | 0 | 96 | 128 | 112 |
| 1-31 | 416 | 224 | 2000 | 600 | 16-20 | 160 | 160 | 2000 | 363 |
| 1-34 | 0 | 64 | 64 | 291 | 16-29 | 64 | 0 | 64 | 392 |
| 1-35 | 0 | 96 | 128 | 172 | 16-31 | 192 | 288 | 2000 | 849 |
| 2-32 | 32 | 32 | 64 | 200 | 17-24 | 32 | 0 | 64 | 247 |
| 2-36 | 64 | 0 | 64 | 258 | 17-39 | 0 | 32 | 64 | 40 |
| 3-10 | 0 | 32 | 64 | 286 | 18-19 | 32 | 0 | 64 | 174 |
| 3-19 | 32 | 0 | 64 | 370 | 19-25 | 0 | 64 | 64 | 237 |
| 4-19 | 64 | 0 | 64 | 200 | 19-37 | 64 | 0 | 64 | 39 |
| 4-34 | 0 | 64 | 64 | 200 | 20-22 | 0 | 64 | 64 | 186 |
| 5-7 | 0 | 64 | 64 | 186 | 20-26 | 0 | 64 | 64 | 280 |
| 5-11 | 0 | 64 | 64 | 280 | 21-28 | 32 | 32 | 64 | 279 |
| 5-18 | 0 | 32 | 64 | 272 | 23-38 | 0 | 96 | 128 | 566 |
| 5-20 | 0 | 128 | 128 | 400 | 24-38 | 0 | 32 | 64 | 72 |
| 5-22 | 64 | 0 | 64 | 175 | 25-31 | 288 | 128 | 2000 | 228 |
| 6-33 | 32 | 0 | 64 | 297 | 25-34 | 64 | 0 | 64 | 253 |
| 6-36 | 64 | 0 | 64 | 200 | 25-35 | 96 | 0 | 128 | 132 |
| 6-40 | 0 | 32 | 64 | 90 | 25-37 | 0 | 64 | 64 | 206 |
| 7-19 | 64 | 0 | 64 | 165 | 27-38 | 64 | 0 | 64 | 404 |
| 8-14 | 64 | 0 | 64 | 121 | 27-39 | 32 | 32 | 64 | 146 |
| 8-16 | 544 | 96 | 2000 | 615 | 28-30 | 96 | 0 | 128 | 396 |
| 8-23 | 96 | 0 | 128 | 400 | 28-32 | 0 | 64 | 64 | 198 |
| 8-24 | 64 | 0 | 64 | 249 | 28-36 | 32 | 96 | 128 | 154 |
| 8-26 | 64 | 0 | 64 | 260 | 28-42 | 64 | 0 | 64 | 311 |
| 8-38 | 32 | 96 | 128 | 400 | 28-43 | 0 | 96 | 128 | 566 |
| 8-41 | 64 | 0 | 64 | 89 | 28-45 | 96 | 0 | 128 | 306 |
| 8-44 | 64 | 0 | 64 | 81 | 30-36 | 0 | 96 | 128 | 512 |
| 9-21 | 0 | 32 | 64 | 218 | 31-36 | 320 | 384 | 2000 | 1458 |
| 9-31 | 32 | 32 | 64 | 181 | 31-38 | 128 | 352 | 2000 | 1185 |
| 10-25 | 64 | 0 | 64 | 200 | 31-39 | 0 | 64 | 64 | 353 |
| 10-40 | 0 | 64 | 64 | 200 | 31-40 | 64 | 0 | 64 | 258 |
| 11-20 | 64 | 0 | 64 | 82 | 33-34 | 0 | 32 | 64 | 174 |
| 12-39 | 0 | 64 | 64 | 170 | 36-45 | 0 | 96 | 128 | 406 |
| 12-42 | 32 | 32 | 64 | 200 | 38-41 | 0 | 64 | 64 | 247 |
| 13-28 | 0 | 96 | 128 | 400 | 38-44 | 0 | 64 | 64 | 121 |
| 13-36 | 192 | 0 | 2000 | 432 | | | | | |

Fig. 12

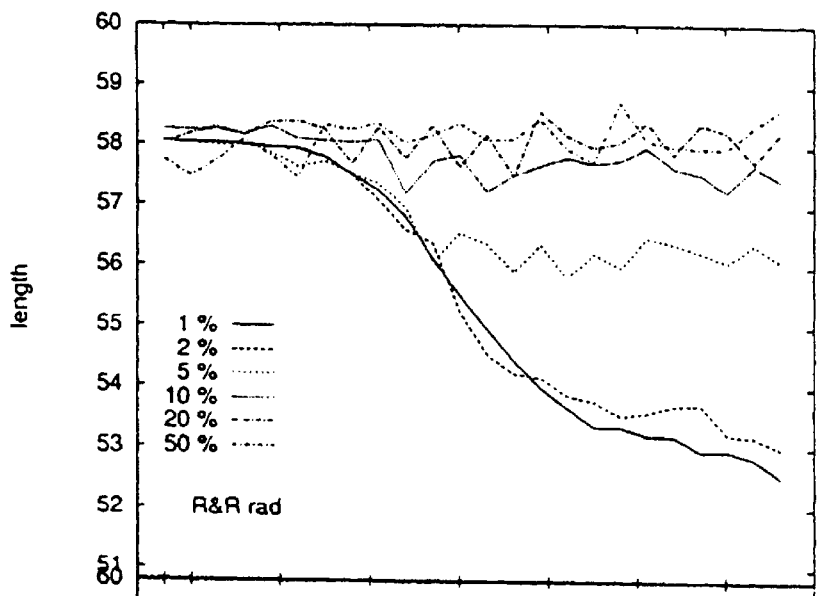
Fig. 16-1
Fig. 16
| Fig. 16-1 | Fig. 16-2 |
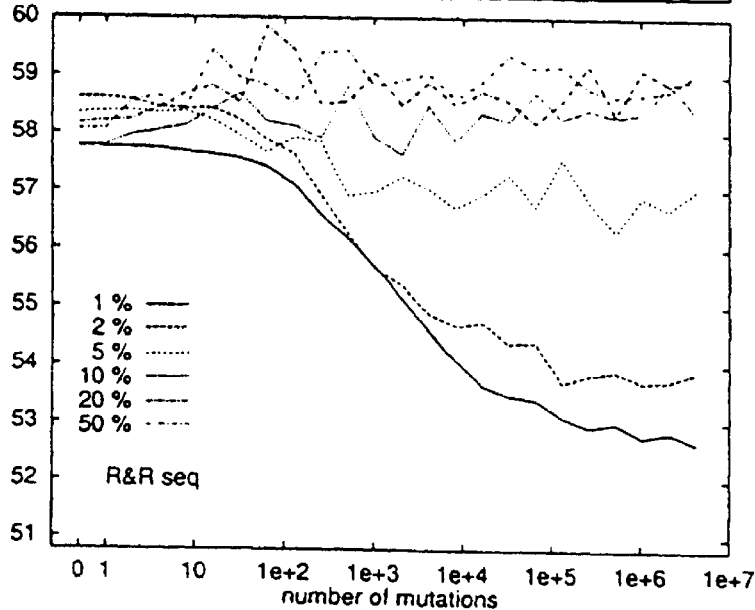

OPTIMIZATION WITH RUIN RECREATE

1. BACKGROUND OF THE INVENTION

1.1 Field of the Invention

The present invention relates to an automatic method of computerized optimization of a technical system like for instance routing systems such as a transportation routing system or a communication network or a supply chain system.

1.2 Description and Disadvantages of Prior Art

State of the art comprises a rich set of classical improvement heuristics of optimization approaches of technical systems. For comparison reasons the different approaches are often applied to published problem instances which are already extensively studied in the literature as the famous Traveling Salesman Problem which was often considered in the literature. For instance G. Reinelt, TSPLIB95, University of Heidelberg, Germany, 1995 and M. Grotschel, O. Holland, Math. Prog. 1991, 51, 141 published such an extensively studied set of traveling salesman problems. Also the problem set of M. Solomon, Operations Research, 1987, 35, 254 could be mentioned at this place.

Optimization of many technical systems can be stated as optimization of a routing system. Due to their importance routing systems have been subject of extensive studies. With respect to the technical problem of transportation routing the following state of the art work could be mentioned:

S. R. Thangiah, I. H. Osman, T. Sun, Hybrid Genetic Algorithm, Simulated Annealing and Tabu Search Methods for Vehicle Routing Problems with Time Windows, working paper, 1994), UKC/OR94/4; J.-Y. Potvin, S. Begio, 1994, A Genetic Approach to the Vehicle Routing Problem with Time Windows, Publication CRT-953, Centre de recherche sur les transports, Universite de Montreal; P. M. Thompson, H. Psaraftis, 1989, Cyclic Transfer Algorithms for Multi-Vehicle Routing and Scheduling Problems, Operations Research 41, 935–946; J.-Y. Potvin, T. Kervahut, B.-L. Garcia, J.-M. Rousseau, 1993, A Tabu Search Heuristic for the Vehicle Routing Problem with Time Windows, Publication CRT-855, Centre de recherche sur les transports, Universite de Montreal; W.-C. Chiang, R. Russell, 1993, Simulated Annealing Metaheuristics for the Vehicle Routing Problem with Time Windows, working paper, Department of Quantitative Methods, University of Tulsa, Tulsa, OK 74104; Y. Rochat, E. Taillard, Probabilistic diversification and intensification in local search for vehicle routing, Journal of Heuristics, Vol 1, No 1, 1995, 147–67.

With respect to the applied methods the following important approaches can be distinguished within the state of the art:

1.2.1 Simulated Annealing and its Relatives

Simulated Annealing as outlined for example in N. Metropolis, A. W. Rosenbluth, M. N. Rosenbluth, A. H. Teller, E. Teller, J. Chem. Phys. 1953, 21, 1087., S. Kirkpatrick, C. D. Gelatt Jr., M. P. Vecchi, Science, 1983, 220, 671, S. Kirkpatrick, G. Toulouse, J. Physique, 1985, 46, 1277., Threshold Accepting as outlined for example in G. Dueck, T. Scheuer, J. Comp. Phys., 1990, 90, 161, the Great Deluge Algorithm as outlined for example in G. Dueck, J. Comp. Phys., 1993, 104, 86, G. Dueck, T. Scheuer, H.-M. Wallmeier, Spektrum der Wissenschaft, March 1993, Record-to-Record Travel technique as outlined for example in G. Dueck, J. Comp. Phys., 1993, 104, 86, and related Monte Carlo-type optimization algorithms as outlined for example in K. Binder, D. W. Heermann, Monte Carlo Simulation in Statistical Physics, Springer, N.Y., 1992, T. J. P. Penna, Phys. Rev. E, 1995, 51, R1–R3 apply ideas of statistical physics and applied mathematics to find near-to-optimum solutions for combinatorial optimization problems. These are all iterative exchange algorithms. They start with an initial configuration and proceed by small exchanges in the actual or current solution to get a tentative new solution. The tentative new solution is evaluated, i.e. its objective function, e.g. its total cost, is computed. The algorithmic decision rule is applied. It is decided if the tentative new solution is kept as the current solution, in case of acceptance the new solution is taken as the new current solution.

1.2.1.1 Decision Rules

The different algorithms work with this same structure, but they use different decision rules for acceptance/rejection. The Random Walk (RW) accepts every new solution. The Greedy Algorithm (GRE) accepts every solution which is not worse than the current solution. Simulated Annealing procedures accept every better solution and, with a certain probability, also solutions being worse than the current solution. Threshold Accepting (TA) algorithms accept every solution which is not much worse than the current solution, where "not much" is defined by a threshold. The Great Deluge Algorithm rejects every solution below a required quality level (the "waterline"). This is in principle a Darwian approach. Instead of "Only the Fittest Will Survive" the deluge principal works with "Only the Worst Will Die"

1.2.1.2 Mutations

Of course, the definition of an exchange in a current solution depends on the optimization problem. Let us look, for instance, at the Traveling Salesman Problem. In order to modify the current solution to get a new tentative chosen solution, different types of Local Search mutations are commonly applied. An Exchange exchanges two nodes in the tour. The Lin-2-Opt approach cuts two connections in the tour and reconstructs a new tour by insertion of two new connections. A Node Insertion Move (NIM, or Lin-2.5-opt outlined for instance in E. Aarts, J. K. Lenstra, Local Search in Combinatorial Optimization, John Wiley & Sons, Chichester, 1997) removes a node from the tour and reinserts it at the best position. Moreover, Lin-3-Opt, Lin-4-Opt and Lin-5-Opt etc., outlined for instance in S. Lin, Bell System Techn. J., 1965}, 44, 2245, S. Lin, B. W. Kernighan, Oper. Res., 1973, 21, 498, are sometimes applied, cutting three, four, and five connections and choosing one of 4, 25, and 208 etc. possibilities to recreate the new tour, respectively.

1.2.2 Set Based Algorithms

Simulated Annealing and related techniques have in common that a new configuration is generated based on the actual one. No information about former configurations is used. Genetic Algorithms and Evolution Strategies both use a large set, of configurations as individua of a .population. Tabu Search saves information about former configurations in its Tabu List and therefore also depends on a set of configurations.

1.2.2.1 Genetic Algorithms and Evolution Strategies

Genetic Algorithms mostly use different kinds of cross-over operators generating children from parent configurations, while Evolution Strategies concentrate on mutations altering a member of the population. With both techniques new configurations are produced; various implementations of these algorithms-only differ in the type of the used mutations and in the choice which configurations are allowed to reproduce or to mix with each other or forced to commit suicide.

1.2.2.2 Tabu Search

Tabu Search, outlined for instance in G. Reinelt, The Traveling Salesman, Springer, Heidelberg, 1994, is a memory based search strategy to guide the system being optimized away from parts of the solution space which were already explored. This can be achieved either by forbidding solutions already visited or structures some former solutions had in common, which are stored in a Tabu List. This list is updated after each mutation according to some proposed rules, which have to guarantee that the optimization run never reaches a solution again which was already visited before, that the Tabu List Size does not diverge, and that a good solution can be achieved.

1.2.3 Problems within Prior Art

For the basic well-known problems in combinatorial optimization these algorithms turned out to be successful for the construction of near-to-optimum solutions. Dealing with complex problems, however, we encountered in severe difficulties using these classical algorithms. If we considered steel mill schedules, airline schedules, wide area networks, or very complex tour planning tasks, we faced troubles.

Complex problems often can be seen as "discontinuous": If we walk one step from a solution to a neighbour solution, the heights or qualities of these solutions can be dramatically different, i.e. the landscapes in these problem areas can be very "uneven".

Solutions of complex problems often have to meet many constraints, and it is often even hard to get just admissible solutions. Neighbour solutions of complex schedules, for instance, are usually inadmissible solutions, and it may be very hard to walk in such a complex landscape from one admissible solution to another neighboured admissible solution. Many forms of the classical algorithms try to avoid the "admissibility problem" by modeling artificial penalty functions, but they typically can get stuck in "slightly inadmissible" solutions which might be not allowed at all.

1.3 Objective of the Invention

The invention is based on the objective to provide an improved method for optimization of technical systems. It is a further objective of the current invention to prevent that the automatic optimization process gets stuck in "slightly inadmissible" solutions violating additional constraints "sligthly".

2. SUMMARY AND ADVANTAGES OF THE INVENTION

The objective of the invention is solved by claim 1. The method for automatic, computer-based optimization of a technical system according to the current invention starts with a description of said technical system by a state $\vec{x}$ with state-variables $x_v$, $v=1, \ldots, N$, The said technical system is rated in a state $\vec{x}$ by a measure (a "cost-function", "energy", . . . ) $f(\vec{x})$. The technical system may be for instance a routing system like a transportation routing system, a communication network or a supply chain system (for instance in the automobile industry) and the like. Said method determines an improved state $\vec{x}_{opt}$ with an improved measure $f(\vec{x}_{opt})$ and said improved state satisfying one or more additional constraints. Said method comprises an initialization-step as step 1, choosing a first state as current-state $\vec{y}$ of said technical system said first state already satisfying said additional constraints. Said method comprises a ruin-step as step 2, destroying said current-state by selecting a subset B of said current-state's state-variables $y_{v\mu}$, $\mu=1, \ldots, M$, and excluding them from the current-state building a reduced-state from the remaining state-variables. Said method comprises a recreation-step as step 3, determining a recreated-state $\vec{Z}$. Said recreated-state being determined by extending said reduced-state by substitute-state-variables $Z_{y\mu}$, substituting said excluded-state-variables of said subset B, and said recreated-state satisfying said additional constraints, and determination of said substitute-state-variables is not guided by the values of said excluded-state-variables. Said method comprises an acceptance-step as step 4, deciding if said recreated-state is to be accepted as a new current-state $\vec{y}$. Said method comprises an iteration-step as step 5, deciding if and how to iterate said method beginning with step 2.

As the technique proposed by the current invention explores from the very beginning (the first state) of the optimization process only states which satisfy the additional constraints (admissible states) by constructing them in accordance with the constraints thus that artificial constructions like penalty terms in the measure (also called "objective function", "energy" or the like) are not required for these constraints. One cannot emphasize enough that this property of the proposed method has tremendous implications. At every time during running an optimization one has a fully admissible solution available. This is in contrary to many other approaches where one is often left with small violations of the given restrictions which one has to resolve in practice by neglection, tolerance, by wiping them out by hand, by brute force or other postprocessing techniques. Always ending with an admissible solution significantly improves practicability. In practice, clean admissible solutions are more important than "acceptable" solutions with certain violations of the additional constraints. Moreover the current invention suggests destroying a subset of the current-state's state variables and thus the method is destroying that state not in a small or local way only (for instance changing a certain value to a small extend only). Instead it teaches to destroy a larder part of the current-state. To ruin a quite large fraction of the state gives one the other additional freedom in the recreation-step. The important advantage is: If one has destroyed a large part of the previous state one has an increased freedom to create a new one. One can reasonably hope that, in this large space of possibilities, it is possible to achieve both: determining an admissible and an improved solution. Stated in more abstract terms the fundamental advantage of the current approach is to divide a large problem (in the worst and most complex case a NP-hard problem) into sequences of partial problems, which in the sum are easier to solve than the large problem. Especially the fact that the partial problems (the destroyed parts of the state) are smaller than the large problem but still are large enough to allow the method to explore larger areas of state space, makes the teaching very efficient in finding improved solutions in the global sense.

Based on these properties the current approach is thus better suited for "discontinuous" problems, "problems with very complex measures/objective functions" or "problems where the solutions have to meet many side conditions". The efficiency improvements of the suggested method allow to find in shorter computing time states which are closer to the optimum state. Moreover as the ruin-step destroys larger parts of the current-state an improved state is much more independent from the state chosen as first state in the initialization-step. This also avoids that the method becomes "trapped" in certain parts of state space.

According to a further embodiment of the current invention said recreation-step determines said substitute-statevariables by construction heuristics and/or exact algorithms recreation. Said recreation-step comprises a substep 3A of selecting at least one of said excluded-state-variables. Further said recreation-step comprises a substep 3B of calculating and assigning a value to said selected-state-variable. Moreover said recreation-step repeats said substeps 3A and 3B until all substitute-state-variables have been determined. In a further variant said recreation-step comprises a best-insertion-step which comprises a substep 3B of calculating and assigning to said selected-state-variable a value optimizing said measure f( ) of said reduced-state extended by said substitute-state-variable with respect to said selected-state-variable.

The proposed procedure of determining a recreated state offers an improved compromise of the complexity to be handled for calculating a recreated state, the quality of the new solutions and the processing speed for performing the required calculations. By selecting only a few of the excluded state variables for recalculation the whole task of "recreate" is further broken down in a sequence of partial and simpler tasks. On the other hand with respect to such a partial task the optimum substitute state variables are calculated. This makes sure that in any case a very good recreated state will be determined.

According to a further embodiment of the current invention said state-variables comprise specifications of a multitude of $N_{Nodes}$ nodes, wherein a neighbourhood-relationship is defining distances between pairs of nodes. Within such a system said ruin-step comprises a radial-ruin-step, wherein a first node and its related state-variables are selected and excluded from said current-state $\vec{y}$. Then a random number $A \geq N_{Nodes}$ is determined and the A–1 nearest nodes of said first node according to said neighbourhood-relationship are selected and the related state-variables of said A–1 nearest nodes are excluded from said current-state y. As a further possibility said ruin-step comprises a random-ruin-step wherein a random number $A \leq N_{Nodes}$ is determined and A nodes are selected randomly and their state-variables are excluded from said current-state $\vec{y}$.

If the ruin operation takes place within a certain neigbourhood of a node it turns out that the optimization procedure is improved significantly. This can be understood as a neighourhoud relationship indicates some sort of "exchangeability" of said nodes. The neighbourhood relationship on the other hand is not limited to a mere geographical relationship of the node. It also may be based on properties assigned to and/or represented by said nodes.

According to a further embodiment of the current invention wherein said state-variables comprising specifications of a multitude of $N_{Nodes}$, and wherein said state-variables comprising specifications of sequences of said nodes. Within this embodiment the ruin-step comprises a sequential-ruin-step, wherein a first node and its related state-variables are selected and excluded from said current-state $\vec{y}$, and wherein a random number $A \leq N_{Nodes}$ is determined and the A–1 preceding or succeeding nodes of said first node are selected and their related state-variables are excluded from said current-state $\vec{y}$. As a further possibility said ruin-step comprises a random-ruin-step, wherein a random number $A \leq N_{odes}$ is determined and A nodes are selected randomly and their state-variables are excluded from said current-state $\vec{y}$.

If within the technical system sequences of said nodes are defined a ruin operation relating to a certain segment of such a sequence turns out to improve the optimization procedure significantly.

According to a further embodiment of the current invention the technical system and said related state-variables describe a routing-system with a multitude of transfer-facilities serving a multitude of locations and said locations requesting transfer-demands between pairs of said locations. The measure are the transfer-costs. The invention teaches a ruin-step which comprises a demand-ruin-step wherein at least one transfer-demand is selected and wherein all state-variables relating to said selected-transfer-demand are selected and are excluded from said current-state $\vec{y}$. Within said recreation-step in substep 3A and 3B the state-variables relating to said selected-transfer-demand are calculated.

To ruin and recreate those state-variables which relate to a demand to be satisfied by said routing systems has the advantage that the reduced state results in a valid system state (of course with the exception that it is not satisfying the destroyed routing demand) and no complex additional determination for the reduced system state is necessary to satisfy the additional constraints. Moreover ruin and recreate operations relating to demands are to a large extend suited for parallel execution. For example in vehicle routing systems the recreate operations have to query all transportation facilities for recalculation of state variables; as "independent objects" said transportation facilities can be queried in parallel. Especially for very complex technical systems like in the current case (being NP-hard for instance) a method being suitable for parallel enablement is most important for performance gains.

According to a further embodiment of the current invention said routing-system is a transportation-routing-system wherein said transfer-facilities are transportation-facilities and wherein said transfer-demands are transportation-demands of transportation-sizes. According to the current invention said ruin-step comprises a transportation-demand-ruin-step, wherein a range of transportation-sizes is determined and wherein state-variables relating to transportation-demands within said range of transportation-sizes are selected and are excluded from said current-state $\vec{y}$. Moreover the inventions treats also transportation-routing-systems, wherein according to a time-window-constraint a transportation-demand is to be served within a time-window-interval. For such systems a ruin-step comprising a time-window-ruin-step is suggested, wherein a range of time-window-intervals is determined and wherein all state-variables relating to demands of time-window-intervals within said range of time-window-intervals are selected and are excluded from said current-state $\vec{y}$.

To ruin and recreate transfer-demands of "similar" transfer-sizes or "similar" time-window-intervals improves the recreate process. As demands being "similar" in this sense may be exchanged in the routing solution with a greater probability without violating the constraints the recreate process will be accelerated.

According to a further embodiment of the current invention said routing-system describes a communication-network, wherein said locations are communication-nodes and wherein said multitude of transfer-demands are communication-demands between pairs of communication-nodes of certain bandwidths to be satisfied by a sequence of trunks, said trunks representing the transfer-facilities, connecting each of said pairs of communication-nodes. Said measure are the communication-costs. The invention teaches a ruin-step comprising a communication-demand-ruin-step, wherein at least one communication-demand is determined and state-variables related to the sequence of trunks connecting the pair of communication-nodes of said determined communication-demand are selected and are excluded from said current-state $\vec{y}$.

The advantages of this teaching are similar to the advantages outlined with the ruin and recreate operations based on demands in general given above.

According to a further embodiment of the current invention said initialization-step is determining said first state by executing said best-insertion-step using a reduced-state, for which all state-variables have been excluded.

Compared to an arbitrary. initial state above first state starts the optimization process already with a "good" solution much nearer to the optimum leading to a performance gain.

According to a further embodiment of the current invention the acceptance-step deciding, if said recreated-state is to be accepted as new current-state, is accepting said recreated-state: according to the random-walk-technique; and/or according to the greedy-acceptance-technique; and/or according to the simulating-annealing-technique; and/or according to the threshold-accepting-technique; and/or according to the great-deluge-technique; and/or according to the record-to-record-travel-technique.

Therefore the current Ruin&Recreate approach can be combined with most known acceptance techniques indicating its flexibility and broad applicability.

3. BRIEF DESCRIPTION OF THE DRAWINGS

FIG. 3 gives a comparison of the R&R results with literature data for problem sets R1, C1 and RC1. Left: comparison to work prior to Rochat et al.; right: comparison to Rochat et al. Results, where R&R gives better results than known appear in bold type style. Lengths are calculated by euclidean distances, exceptions with truncation to one decimal place are marked by an asterisk.

FIG. 4 gives a comparison of the R&R results with literature data for problem sets R2, C2 and RC2. Left: comparison to work prior to Rochat et al.; right: comparison to Rochat et al. Results, where R&R gives better results than known appear in bold type style. Length are calculated by euclidean distances.

FIG. 5 represents the best improvements found for tour sequences for instances of R107, R202, RC105 and RC206. For the single vehicle tours the number of customers "c" its length l and the total loading due to the serviced customers $l_{lot}$ is given.

FIG. 6 shows the statistics of 50 runs of the distribution of the final lengths, calculated from R&R, for problems R107, R202, RC105 and RC206. ρ is the probability of a R&R solution to consist of $"_T$ tours, l is the best known length of the problem instance, and $l_{min}$, <l>, $l_{max}$ and $σ_l$ are the minimal, mean, maximum final length and the standard deviation of our runs consisting of $n_T$ tours.

Figure 7A:
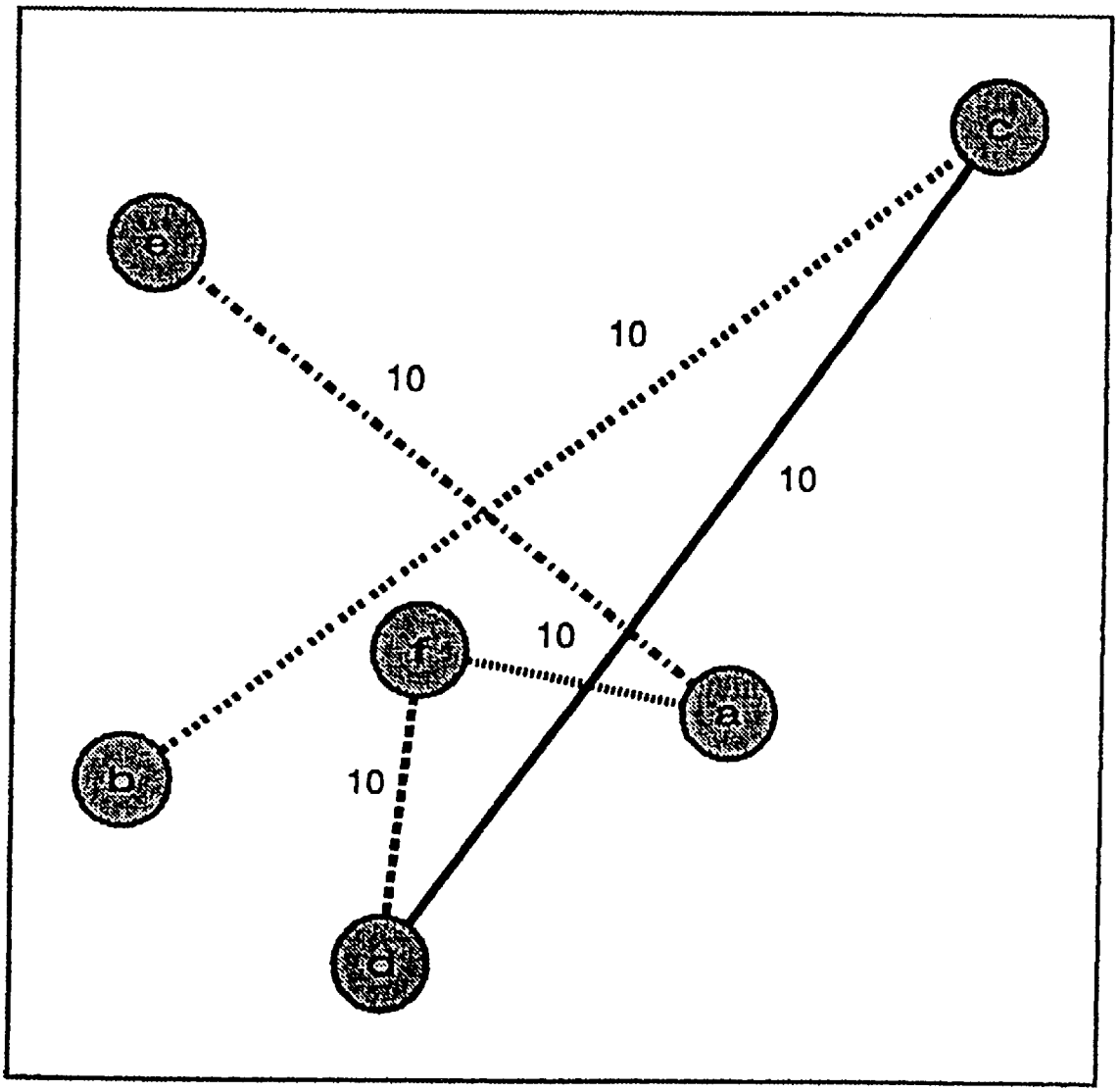
Figure 7B:
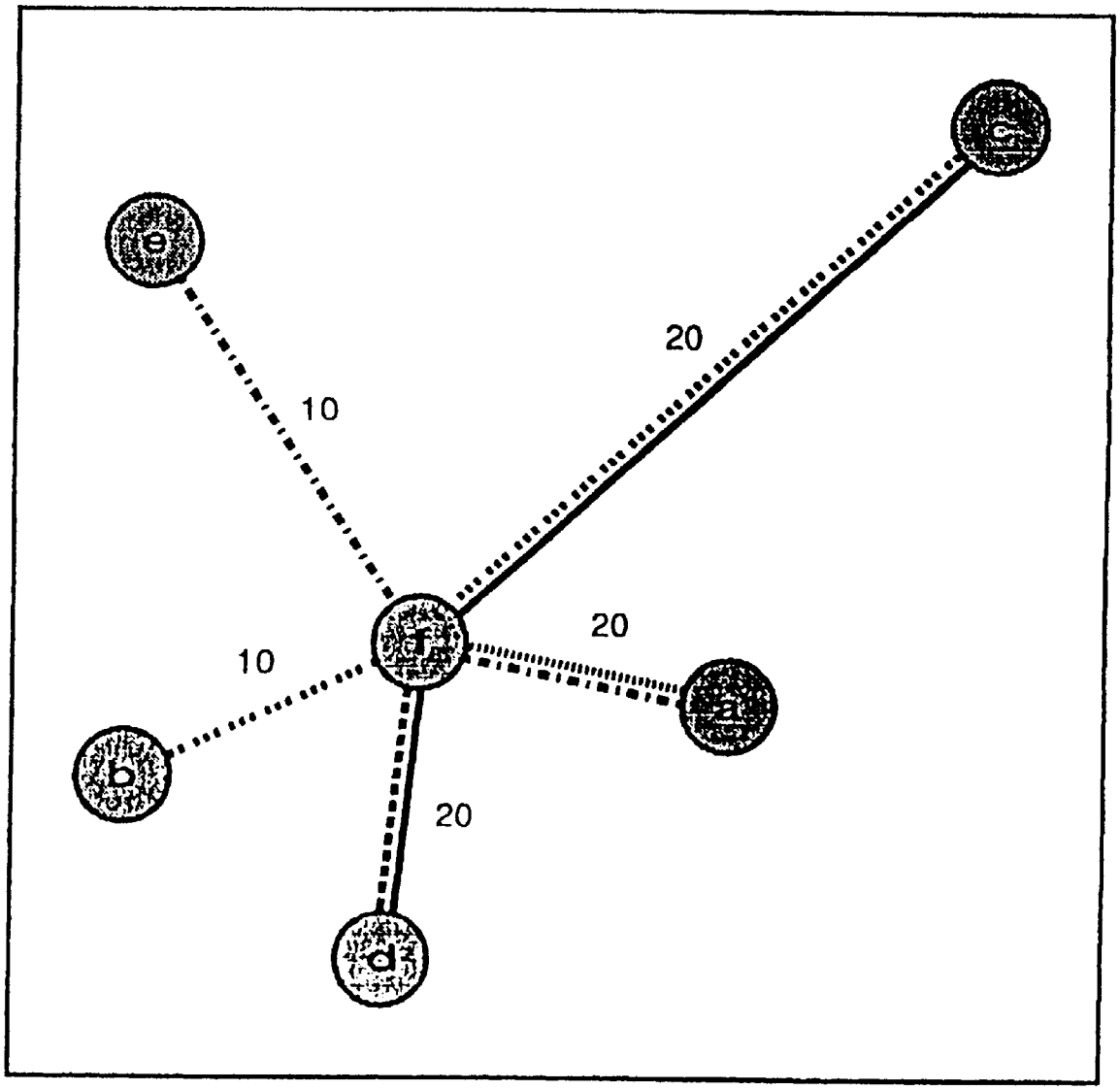

FIG. 7 is a diagram reflecting an example of the RND (Redundant Network Design) problem of 6 locations with 5 demands of 10 Mbps. Left: input demands and 1-hop NRND optimum (Non-Redundant Network Design) with total length 885; right: 2-hop NRND optimum with total length 562.

Figure 8:
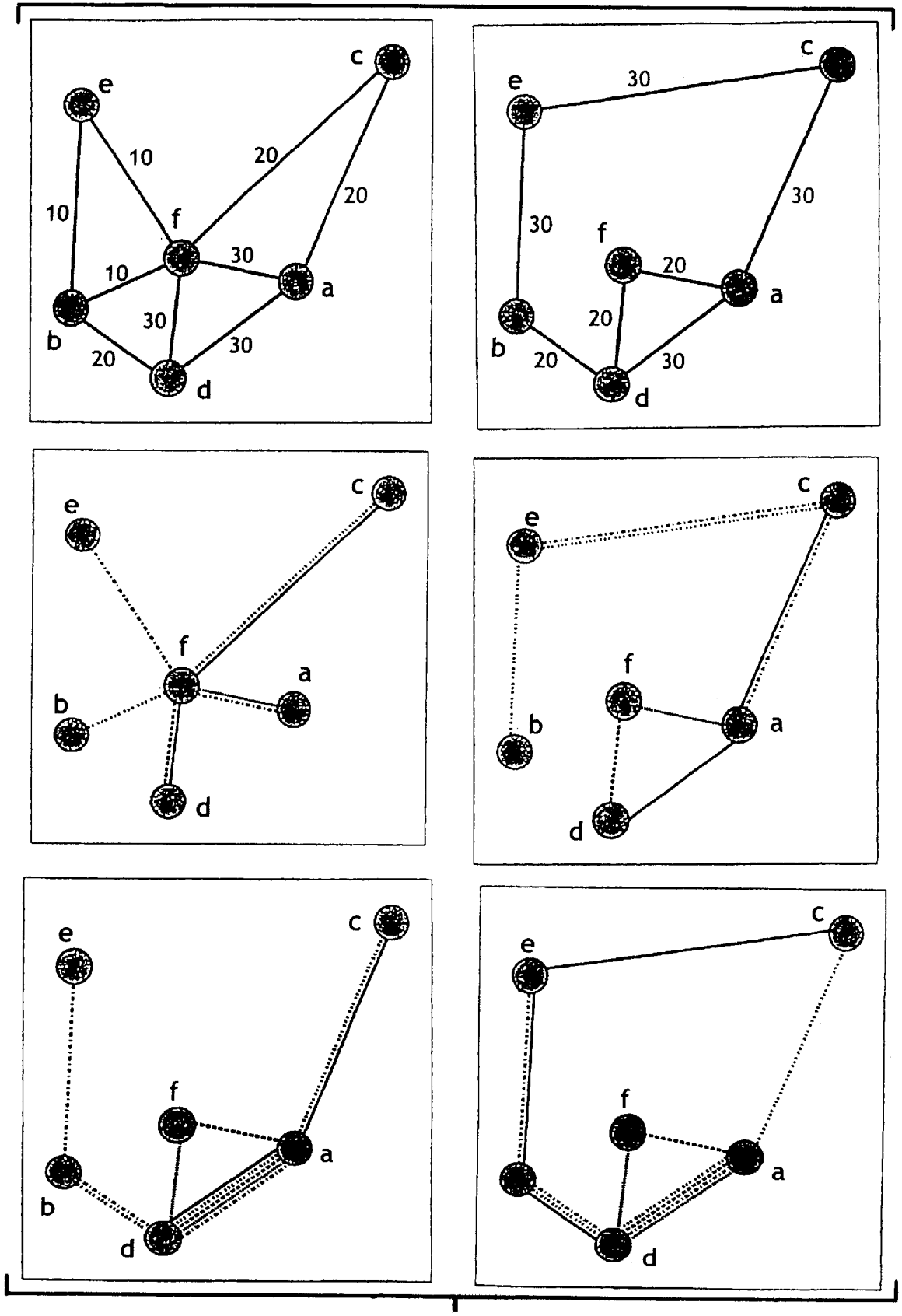

FIG. 8 reflects the best solution obtained for the example problem of FIG. 7. Left: 2-step 2/3-hop RND optimum with total length 1048; right: 2/3-hop RND optimum with total length 861.

FIG. 9 gives details of the configuration of the example system N15 and the optimization results. Listed are the coordinates x and y of the single nodes, the switch facility S, its bandwidth need D (in Kbps) to the computing center C, and the optimized routings $r_{ord}$ and $r_{alt}$ for the normal case and for the failure case, respectively.

FIG. 10 reflects the 24 links used in the optimized system N15. Listed for each link is the accumulated bandwidth $b_{ord}$ due to the normal routings $r_{ord}$, the accumulated bandwidth $b_{alt}$ due to the routings in case of failure $r_{alt}$, the bandwidth $b_t$ of the trunk needed, and its cost. All bandwidth are given in Kbps.

FIG. 11 gives details of the configuration of the example system N45 and the optimization results. Listed are the coordinates x and y of the single nodes, the switch facility S, its bandwidth need D (in Kbps) to the computing center C, and the optimized routings $r_{ord}$ and $r_{alt}$ for the normal case and for the failure case, respectively.

FIG. 12 reflects the 79 links used in the optimized system N45. Listed for each link is the accumulated bandwidth $b_{ord}$ due to the normal routings $r_{ord}$, the accumulated bandwidth $b_{alt}$ due to the routings in case of failure $r_{alt}$, the bandwidth $b_t$ of the trunk needed, and its cost. All bandwidth are given in Kbps.

Figure 13:
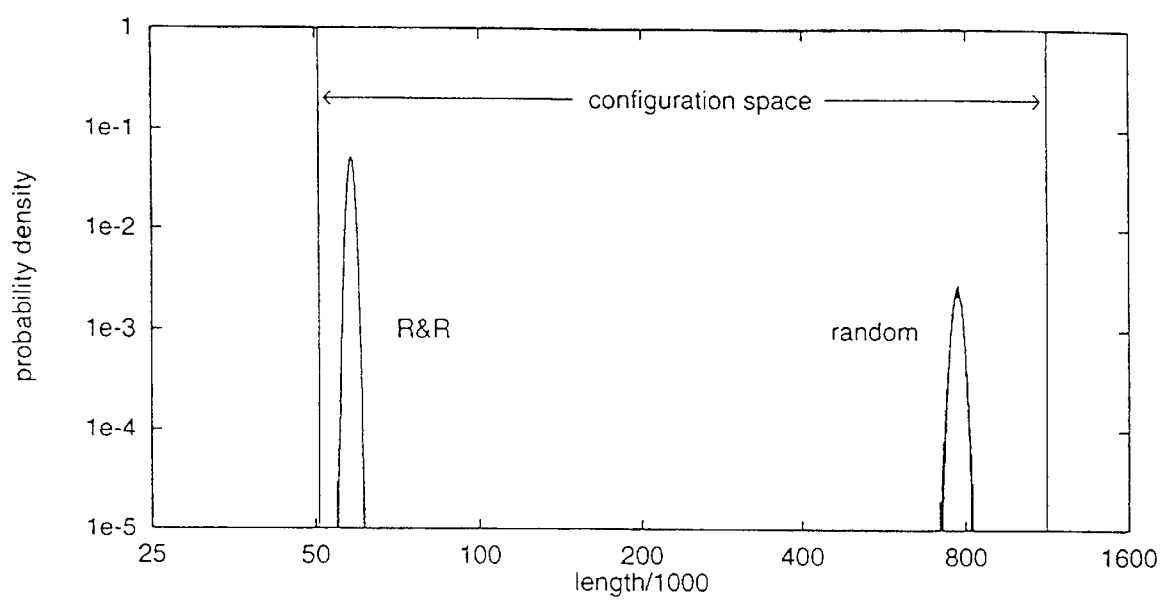

FIG. 13 shows the distribution of the lengths achieved with the R&R approach using best-insertion heuristics (left) and achieved with. random generation (right) for the PCB442 TSP problem as a test example.

Figure 14:
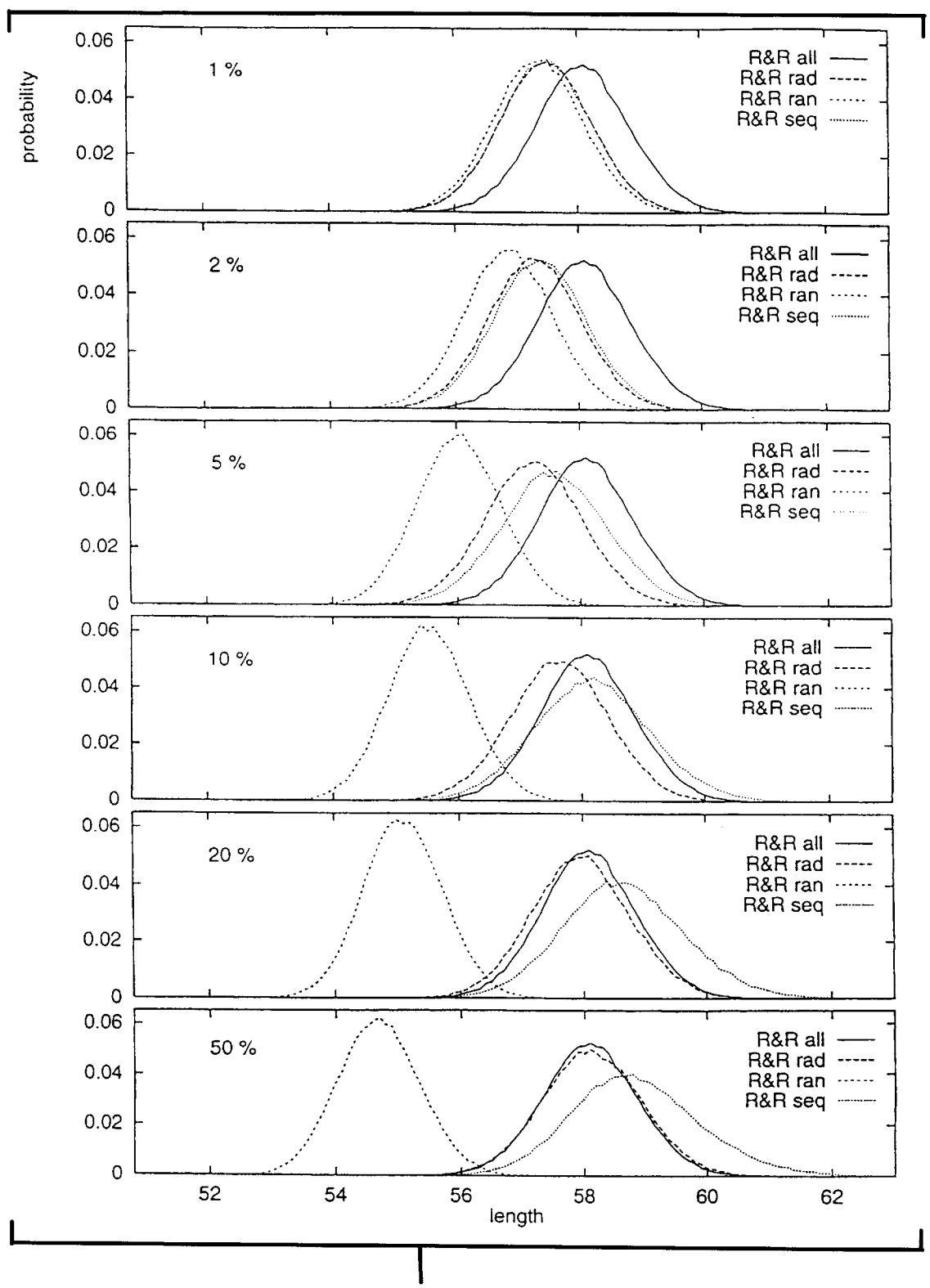

FIG. 14 shows the distributions after constructing a solution with the best-insertion heuristics and then performing 100 mutations in a Random Walk, either with radial, random, or sequential ruin, for different ratios of F for the PCB442 TSP problem as a test example.

Figure 15:
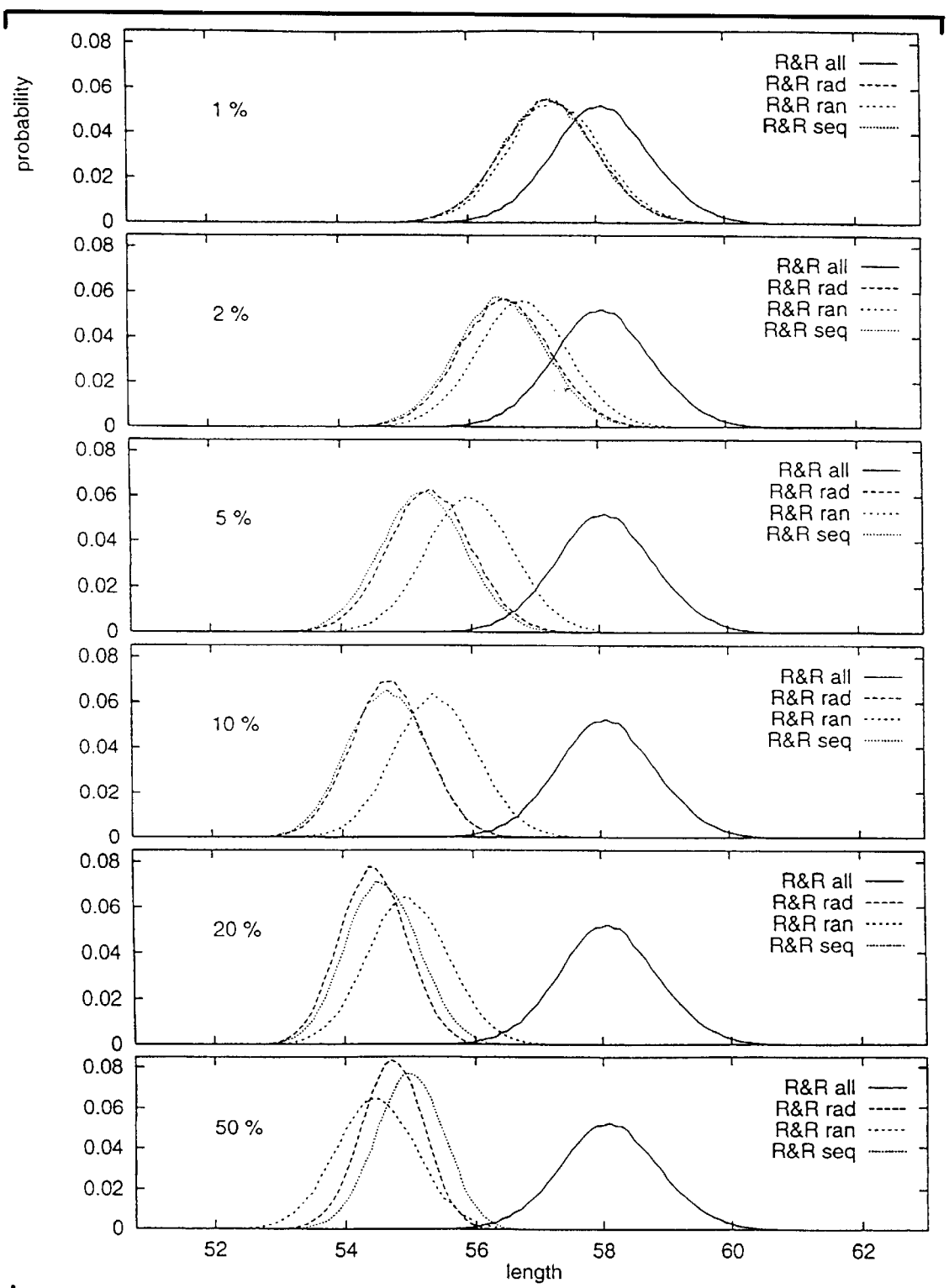

FIG. 15 shows the distributions after constructing a solution with the best-insertion heuristics and the, performing 100 mutations using Greedy Acceptance, either with radial, random, or sequential ruin, for different ratios of F.

Figures 2, 16:
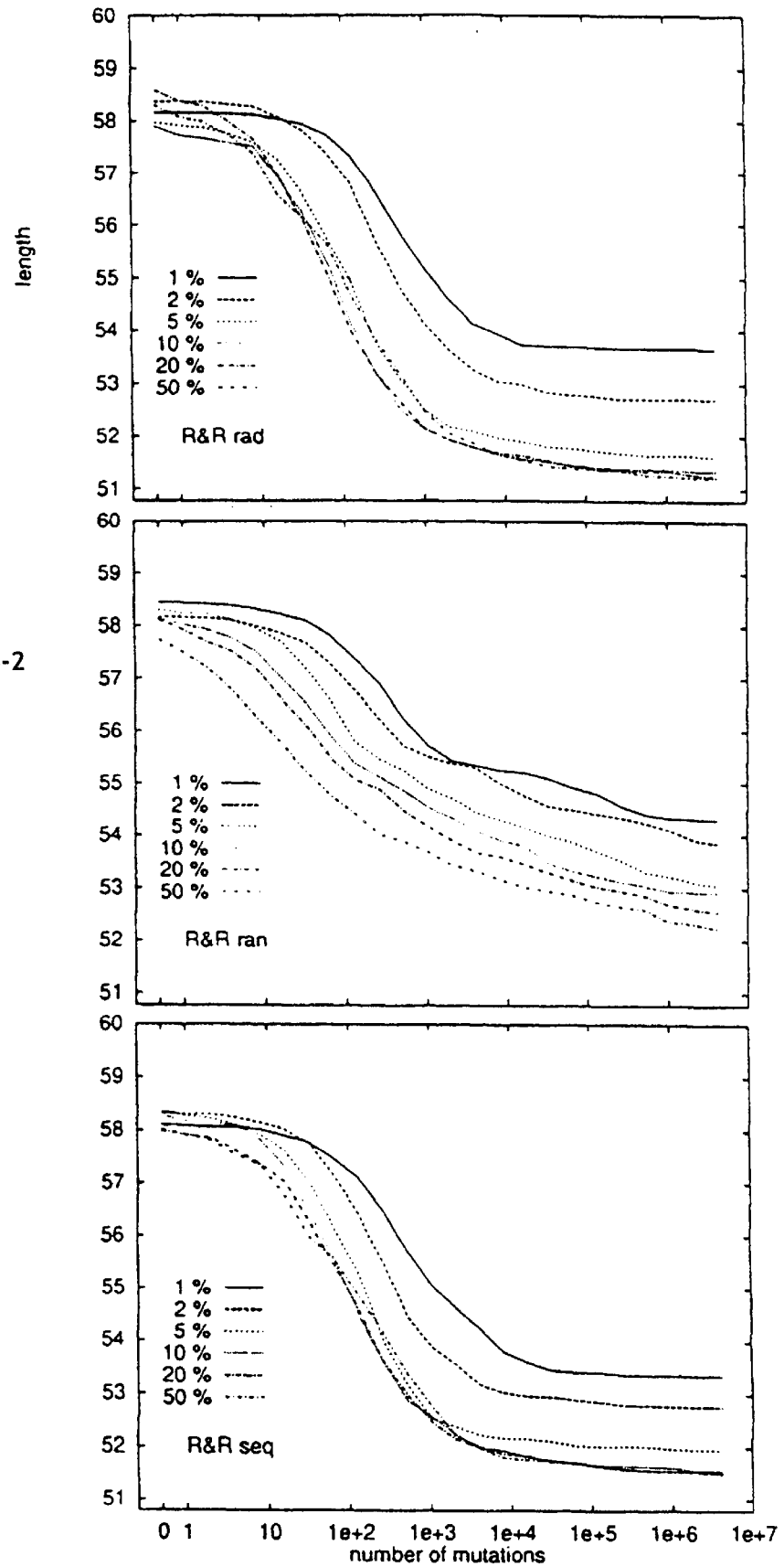

FIG. 16 shows the averaged length as a function of. the number of the R&R mutations, starting from an R&R all configuration for choosing radial, random, and sequential ruin with different fractions F for the PCB442 TSP problem as a test example;

left: for Random Walk; right: for Greedy Acceptance.

Figure 17:
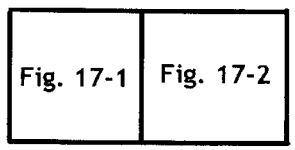
Figures 1, 17:
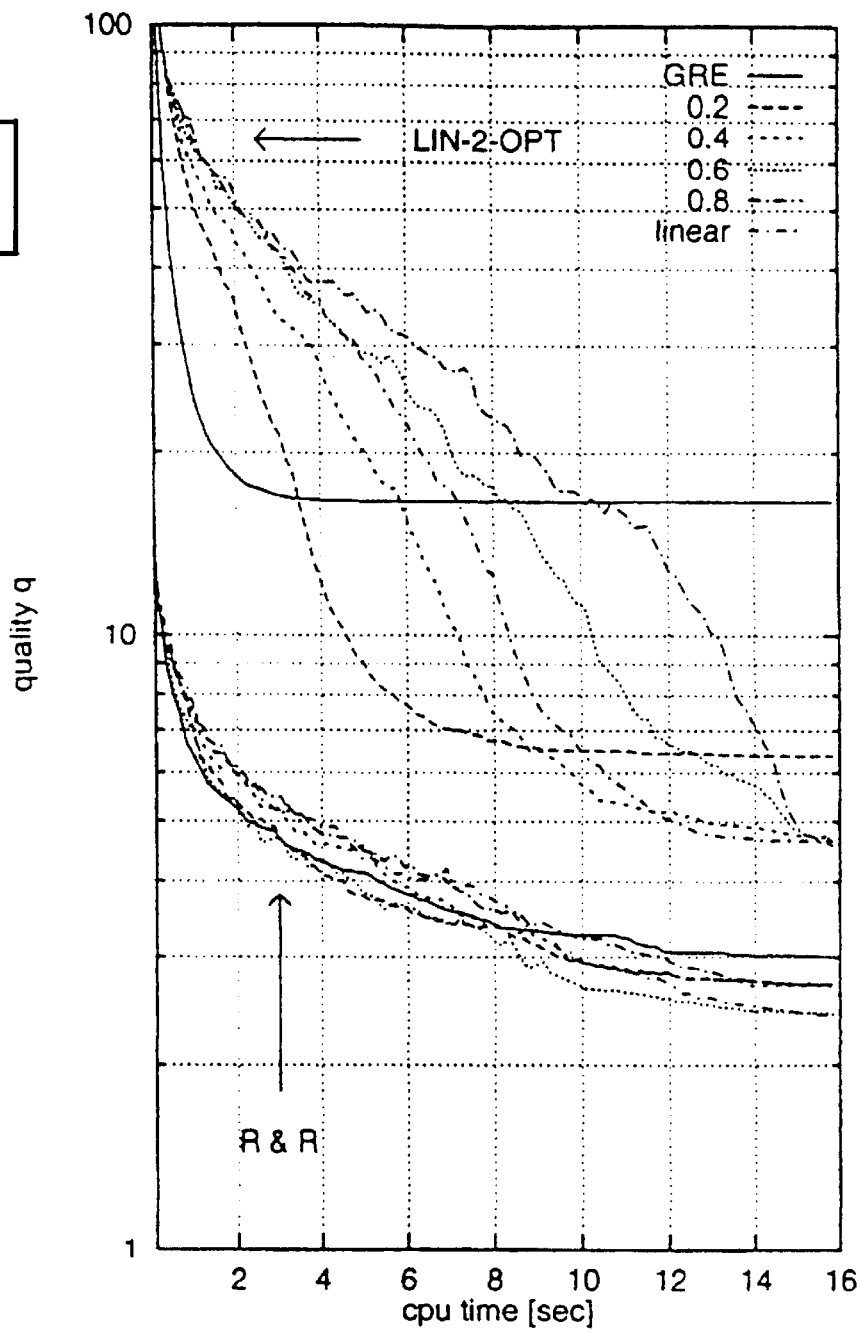
Figures 2, 17:
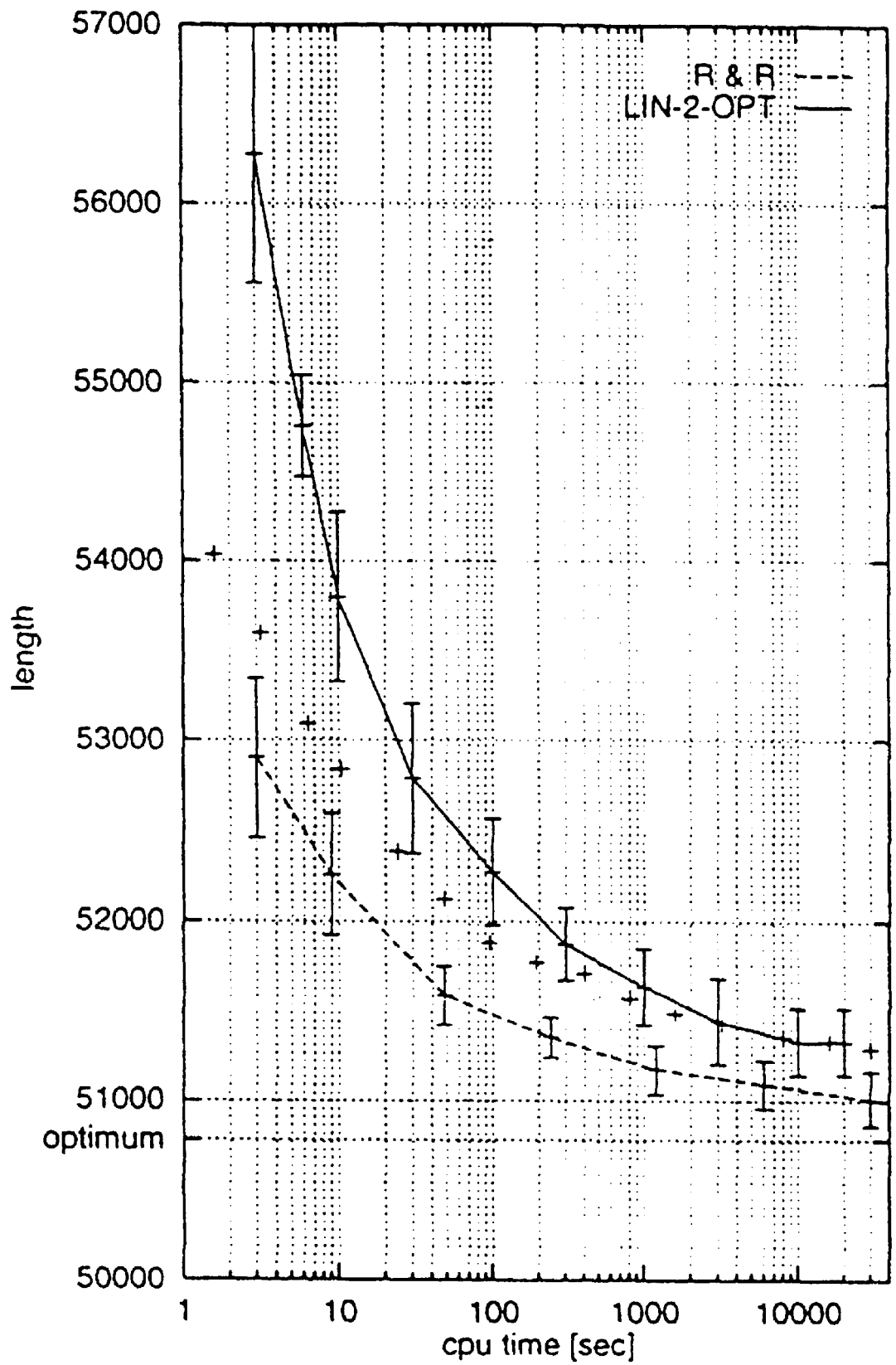

FIG. 17 shows time development of the quality q (left) and optimization results, averaged over 50 runs, using R&R and Lin-2-opt with different cooling schedules based on Threshold Accepting.

4. DESCRIPTION OF THE PREFERRED EMBODIMENT

If the current specification is referring to routing systems (in specific to transportation routing systems and communication networks), this does not limit the applicability of the proposed teaching to other technical systems.

4.1 A First Look at the Principle of Ruin & Recreate (R&R)

Before we give a more systematic introduction, we want to give the reader a quick feeling for this new class of algorithms we introduce here. The basic element of our idea is to obtain new optimization solutions by a considerable obstruction of an existing solution and a following rebuilding procedure. Let's look at a famous Traveling Salesman Problem (TSP) which was often considered in the literature (the PCB442 problem of Grötschel). Suppose we have found some roundtrip through all of the 442 cities like in the FIG. 1.

The top left part 110 is our initial or current solution of the problem showing a tour (the links) trough the various "cities" (the nodes). We destroy now a significant part, the area 111, of the solution. That's the easy part of it. When destroying the solution, think of meteorites or, if you like, of bombs. The solution may be hit by such a meteorite, or a bomb is dropped on it. Mathematically spoken: we take some cities in the area 111 out of the current tour and connect the remaining (or surviving) cities to a shorter round trip, i.e. a reduced state of the problem, which is reflected in the top right part 120 of FIG. 1. We say, "the cities which are hit by the meteorite are not served by the traveling salesman any longer". In the final step, reflected in the bottom part 130, we recreate (see 131) this partial solution after its bombardment to a full TSP solution again. That's the harder part of the algorithm. There are many ways to recreate the ruined part of the solution, such that this is obviously an important point to be discussed in this specification.

This gives a first imagination of how the Ruin&Recreate (R&R) principle works. In terms of a R&R based optimization routine one has to think about the kind and size of the meteorites and to how to recreate destroyed parts of the solution. In contrary to the current approach optimization algorithms work with very small or very local changes in a current solution. In this approach however we deal with considerable changes "made by meteorites". We can overlay a decision rule whether we should accept the rebuilt structure or rather keep the original one. We could only accept better solutions ("Greedy Acceptance") or proceed according to Simulated Annealing or Threshold Accepting methods. In other words the current approach can be combined with any type of acceptance strategy.

4.2 The Ruin & Recreate (R&R) Strategy

Optimization is often viewed under the "paradigm of hill climbing". If we program iterative optimization heuristics for the traveling salesman problem, for scheduling problems or for chip placement tasks, we imagine that we have to find the highest places in huge mountain ranges. These "mountains" are parts of landscapes of vast spaces of traveling salesman roundtrips, spaces of schedules, spaces of placements. We imagine that we are walking around on the surfaces of such landscapes, and we are looking for "best places", for very high spots in this world. An optimization algorithm is viewed as a rule to walk around and to decide where to go and when to stop. One step in this world, from spot to spot, is an analogue for the computer evaluation of a roundtrip, say, and its neighbour roundtrip, which is "one step away". Algorithms try to walk from poor or quite good solutions to very good ones, excellent ones, or even optimum solutions. Greedy algorithms just try to gain height by walking up as long as possible. Advanced methods like the famous Simulated Annealing technique or the Threshold Accepting procedure also allow for down-steps, but they gain height in the long run during a long walk in the problem landscape.

For the basic well-known problems in combinatorial optimization these algorithms turned out to be extremely successful for the construction of near-to-optimum solutions. Dealing with complex problems, however, we encountered severe difficulties using these classical algorithms. If we considered steel mill schedules, airline schedules, wide area networks, or very complex tour planning tasks, we faced troubles.

Complex problems often can be seen. as "discontinuous": If we walk one step from a solution to a neighbour solution, the heights or qualities of these solutions can be dramatically different, i.e. the landscapes in these problem areas can be very "uneven".

Solutions of complex problems often have to meet many constraints, and it is often even hard to get just admissible solutions. Neighbour solutions of complex schedules, for instance, are usually inadmissible solutions, and it may be very hard to walk in such a complex landscape from one admissible solution to another neighboured admissible solution. Many forms of the classical algorithms try to avoid the "admissibility problem" by modeling artificial penalty functions, but they typically can get stuck in ‚slightly inadmissible" solutions which might be not allowed at all.

In this specification, we plead for a more complex paradigm than the usual hill climbing view of the optimization problem. We introduce here the Ruin & Recreate paradigm, which seems to us the more natural view of complex optimization tasks. In order to explain our ideas properly, let us give at the beginning an introduction of our thoughts in our all-day-surrounding. In the hill climbing paradigm, we think in terms of height. We are looking for high points. In our life, we measure high prices, esteem high-ranking officers, positions, or degrees. We speak of high temperatures, high probabilities, high bets, high profits, and very high alcohol levels. This is talking within the hill climbing frame.

Complex things, however, cannot be measured rather simply in height. We say, if these things look good: "That's fine." We know exactly what we mean, if we speak of a fine example, a fine novel, fine characters or manners, fine clothes, meals, holidays, or wine selections. Let us try to think in terms of fineness. When we had to construct best air traffic schedules, then we know basically, what fine means. However, it is not easy to write it down as an objective function for an optimization routine. In these complex situations we are forced to define objective functions which are constructed from many components and weight factors and penalties forming a complex expression of harmonized elements to measure fine. If we had to construct a model for our new fine castle complex, how would we do that? Would we try to get a better and better model by performing small permutations or exchange steps when we are working on our castle? No, we would proceed "more natural" on this problem: We would try "another second tower" or try "a different length drawbridge". We would destroy comparatively large parts of our model, and we would try to recreate the missing parts of the model in the best possible way. What is, if we had to construct a better organizational model of a world leading company? we would reorganize the management structure by truly heavy moves—as every real CEO does every beginning year.

This is the way we think in the new paradigm: Ruin & Recreate. We look at a particular solution of our problem. We ruin a quite large fraction of the solution and try to restore the solution as best as we can. Hopefully, the new solution is finer for us than the previous one. The R&R approach will show an important advantage in this paper: If we have destroyed a large part of the previous solution we have a lot of freedom to create a new one. We can reasonably hope that, in this large room of possibilities, it is possible to find again an admissible and a fine solution. The Ruin & Recreate paradigm is a shift from the hill climbing thinking (in height) to a thinking on fine complex structures. It is better suited for "discontinuous" problems, problems with very complex objective functions (fine instead of high), problems where the solutions have to meet many side constraints.

We demonstrate the power of the new paradigm by numerical results for the tour planning problem with time-window constraints. We chose this problem area because we felt that this problem is the "easiest of the complex" problems. It is "hard enough" to recognize that the classical algorithms may be not really suited here anymore. It is "easy enough" to find some published problem instances which are already extensively studied in the literature for comparison reasons. We took from the library of Solomon more than 50 problem instances and tested our R&R implementation on them. In most cases, our R&R implementation gave solutions at least as good as the currently published record. In many cases, we could achieve better and much better results.

Throughout this description we will study R&R algorithms which build one admissible solution after each other. We don't use artificial constructions like penalty terms in the objective function at all. We cannot emphasize enough that this property of the new R&R principle has tremendous implications for, say, commercial tour planning systems. At every time during running a R&R optimization a fully admissible solution is considered. This is in contrary to other tour planning implementations where one is often left with small violations of the given restrictions which have to be resolved in practice by neglection, tolerance, by wiping them out by hand, by brute force—take a full additional truck for a small packet, or by calling a customer for a more suitable time window. If one ever worked in practice with a tool not ending constantly with clean solutions one will certainly esteem this practical property of R&R. One would even use this type of algorithm if it would give worse results. In real practice the current invention suggests that clean solutions are more important than "a few miles less" comprising certain violations of the constraints.

4.3 R&R for Vehicle Routing
4.3.1 Introduction

We turn to the optimization of vehicle routing. For simplicity reasons (though the invention is not limited to) we only consider problems, where a fleet of vehicles starts from a central depot. All the vehicles have a given maximum capacity. They serve a set of customers with known demands. The solution of the VRP (vehicle routing problem) consists of a minimum cost set of routes of the vehicles satisfying the following conditions: Each vehicle starts and ends its route at the central depot. Each customer is served exactly once. The sum of the demands of all customers served by a single vehicle does not exceed its capacity. The cost of a set of routes for the VRP!is the sum of the length of all routes. Each customer may add a time window or time intervall restriction to the problem, that is, for every customer there is an earliest and a latest time where the vehicle is allowed to serve the customer. If such restrictions are imposed,. we speak of the VRPTW (vehicle routing problem with time windows).

In the literature there is a well known collection of 56 VRPTW instances from Solomon which is used by many researchers for evaluation of their VRPTW solving systems. These problems can be classified into 3 groups, with distinct characteristics of the distribution of the customer locations: random (R), clustered (C), and a mixture of both (RC). Furthermore, each of these groups can be splitted into problems with low vehicle capacity (type 1) or high vehicle capacity (type 2). One therefore generally speaks of six problem sets, namely R1, C1, RC1, R2, C2 and RC2. Members of a single set vary both in the distribution of the time windows and in the demands of the single customers. All problems consist of 100 customer locations. Both, the distances and the travel times between the customers are given by the corresponding euclidean distances. Therefore, this library incorporates many distinguishing features of vehicle routing with time windows: fleet size, vehicle capacity, spatial and temporal customer distribution, time window density, time window width and customer service times. The objective of the problem is to service all customers while first minimizing the number of vehicles and second minimizing the travel distance.

Results in the literature are not completely comparable. While some authors used euclidian distances, others truncated the distances to one decimal place. The reason for the truncation is, that some exact algorithms for solving VRPTW are integer based, like dynamic programming. Following the teaching of Thangiah et al. and Rochat et al. we used real, double-precision distances. Desrochers et al. in M. Desrochers, J. Desrosiers, M. Solomon, Operations Research, 1992, 40, 342, used a LP relaxation of the set partitioning formulation of the problem and solved it by column generation. The LP solutions obtained are excellent lower bounds. With a branch-and-bound algorithm they solved 7 out of the 56 problems exactly. Potvin et al. used Genetic Search to solve the VRPTW. The basic principle they used is the creation of a methodology for merging two vehicle routing solutions into a single solution that is likely to be feasible with respect to the time window constraints. Thangiah et al. applied a technique where customers are moved between routes defining neighbourhood solutions. This neighbourhood is searched with Simulated Annealing and Tabu Search. The initial solution is obtained using a Push-Forward Insertion heuristic and a Genetic algorithm based sectioning heuristic. They solved 56+4 problems from the literature, for 40 of which they obtained new optimum solutions. For 11 out of the 20 remaining problems they received solutions equal to best known. Later, Rochat et al. adopted their probabilistic technique to diversify, intensify and parallelize local search to the VRP and VRPTW. They used a simple first-level tabu search as basic optimization technique and were able to significantly improve its results by their method. In using a post-optimization procedure they improved nearly 40 of the 56 instances. This shows that their method has in most cases significant advantages over the previous methods.

4.3.2 Ruin

Figure 1:
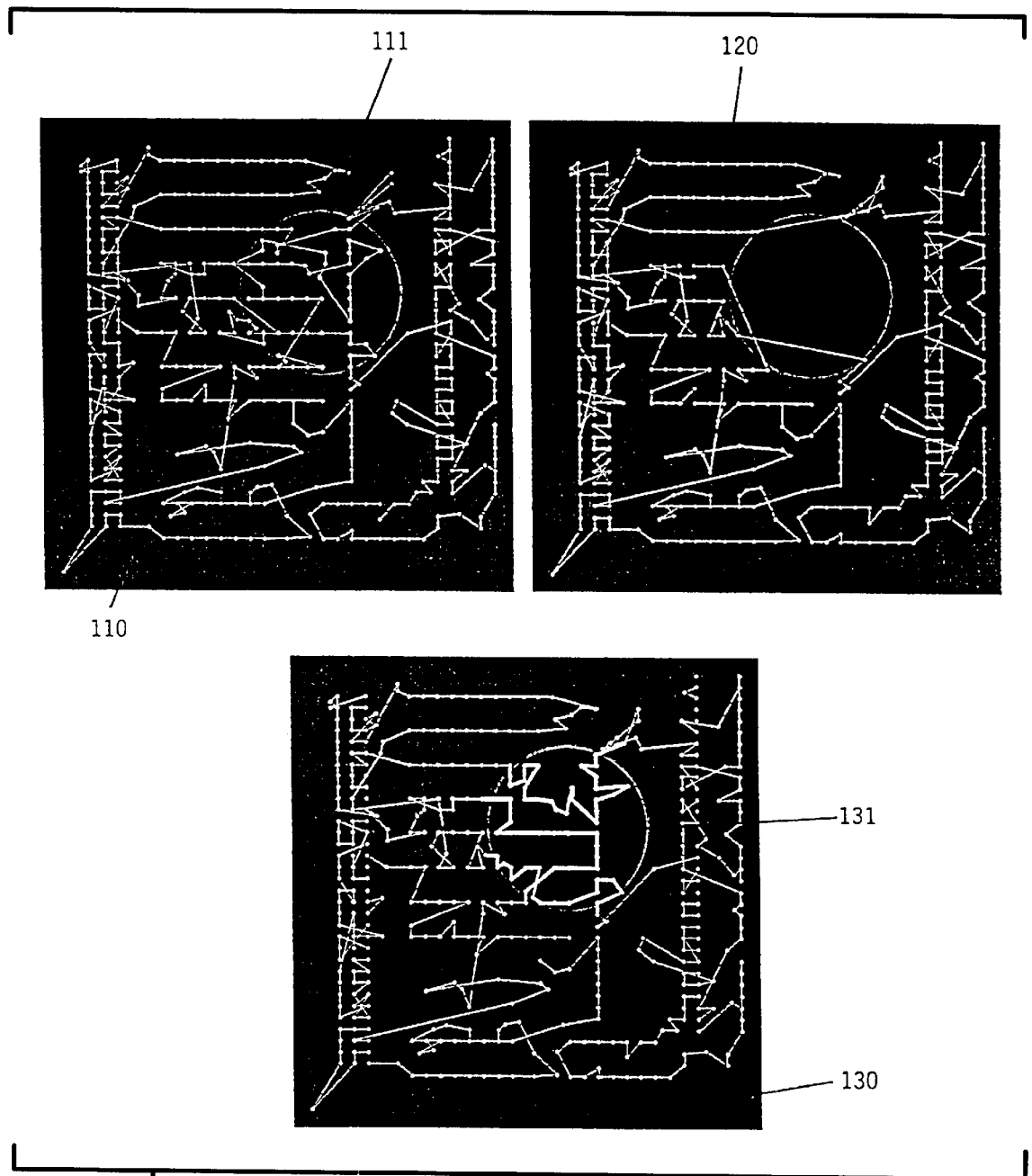
FIG. 1 is a diagram reflecting the base approach of Ruin&Recreate for the Travelling Salesman Problem (TSP) PCB442 of Grötschel.

Together with FIG. 1 we outlined a TSP example for "ruin": We removed all those cities from a round trip that were located in the radial "bombed" area. Let's use a different wording for "a city being destroyed". We would like to say: "a city is not 'served anymore by the travelling salesman." After the ruin the salesman is serving only all the cities that remain after the bombing. If we deal with vehicle routing, we shall destroy a solution by removing destinations or customers or packets to be delivered. We say, these customer destinations are not serviced anymore after being hit by a bomb. When we discuss the recreation step, we say: these customers try to be serviced again, this time by the most appropriate vehicle. There are many ways to destroy a solution. In the below we give some exact definitions of particular bombs we used in our implementation. Of course, you may feel free to invent new weapons. Let's browse briefly through some ideas.

For the TSP, you could bomb according to the first section. We call this procedure radial ruin. We can remove cities from the service by flipping coins: every city is removed with a certain probability. We can remove a shorter or longer string of cities within a round trip,. For the vehicle routing problems, there are many more promising fashions to destroy solutions. Since every vehicle rides along a round trip, all TSP destruction methods can be used either. But we have a broader spectrum of possibilities. Of course, we can remove all customers inside a disk in a plane. This is a type of "Space Bomb". We could also remove every customer which is serviced in the current solution inside a certain time interval: this is a "Time Bomb". Furthermore, we could apply "Volume Bombs" or "Weight Bombs" who remove customers receiving packets whose weights or volumes are in a certain range. All these bombs removed customers who are neighboured in some sense. From our studies on the knapsack problems we found that packet exchanges are most useful if they are restricted to packets of similar size. Within the new framework we present here we would say that we had used Volume Bombs of small size.

Moreover the various bomb types can be combined forming a type of "hybrid bomb". Two bomb types could be combined such that the union or only the intersection of the customers effected by the bomb types are removed. A "space-time-bomb" would be such an example.

Let's start here to define some kinds of ruins: Some packets to be delivered or customers to be served or cities to be visited are removed from the system T. They are not served any longer, or we say, they are put into a bag B of unserved items. Radial Ruin: This is the classical ruin where the imaginative picture comes from., Select randomly a node c from the set T of all N nodes (packets, customers, cities). Select a random number A with $A \leq [F \cdot N]$, F being a fraction, a number between 0 and 1. Remove c and its A−1 nearest neighbours from T and put them into the bag B. The "Nearest Neighbours" are defined according to a certain metric. For our tour planning instances we use the euclidian distance. Random Ruin: Select a random number A with $A \leq [F \cdot N]$, $0 \leq F \leq 1$. Remove A randomly selected nodes from T and put them into B. Note that random ruin is a global strategy whereas radial ruin is a more local one. Sequential Ruin: Remove $A \leq [F \cdot N]$ succeeding nodes from a single, randomly selected round trip.

4.3.3 Recreate

Suppose we have thrown a bomb and destroyed a solution. This means, that we have a set of customers which are no longer serviced (by a salesman or by a vehicle). The recreation of the solution means the reinsertion of these customers into the system. Ideally, we could try to invent an algorithm such that the solution is recreated exactly optimally. On the other hand, we could try to take every customer, one after another, and insert him into the system in a more or less clever way. We see that there is a whole universe of methods to recreate the system. In this paper, we want to present the principle of R&R, the pure idea. We have restricted ourselves to study the most obvious recreation at all: best insertion. Best insertion means: add all customers out of service successively in the best possible way to the system. Do not violate any restriction (e.g. time window constraints), such that every recreation ends up in an fully admissible solution. It has to be stressed that other insertion strategies could be combined with the current teaching, thus best insertion is just one possible approach. Let us emphasize another point: We used only this rule of best insertion, and we could achieve record results by exclusively using this raw principle. Of course, it is possible to study more elaborated, more sophisticated, more hybrid algorithms to achieve better results. However, this is not the primary intention of the present work. We just want to state the power of the most simple form of R&R, which is the following: In a partially destroyed routing solution we have a certain number of customers (or cities) put into the bag. Now, we take these customers in a random order out of the bag and perform best insertion: The customer asks every vehicle if and at which position it is possible to serve him on its tour and what the additional costs would be. The minimum cost insertion is chosen. It may not be possible at all to insert a customer into the solution due to the capacity or time window constraints. In this case, an additional vehicle is inserted into the system.

4.3.4 The Overall Optimization Procedure

Figure 2:
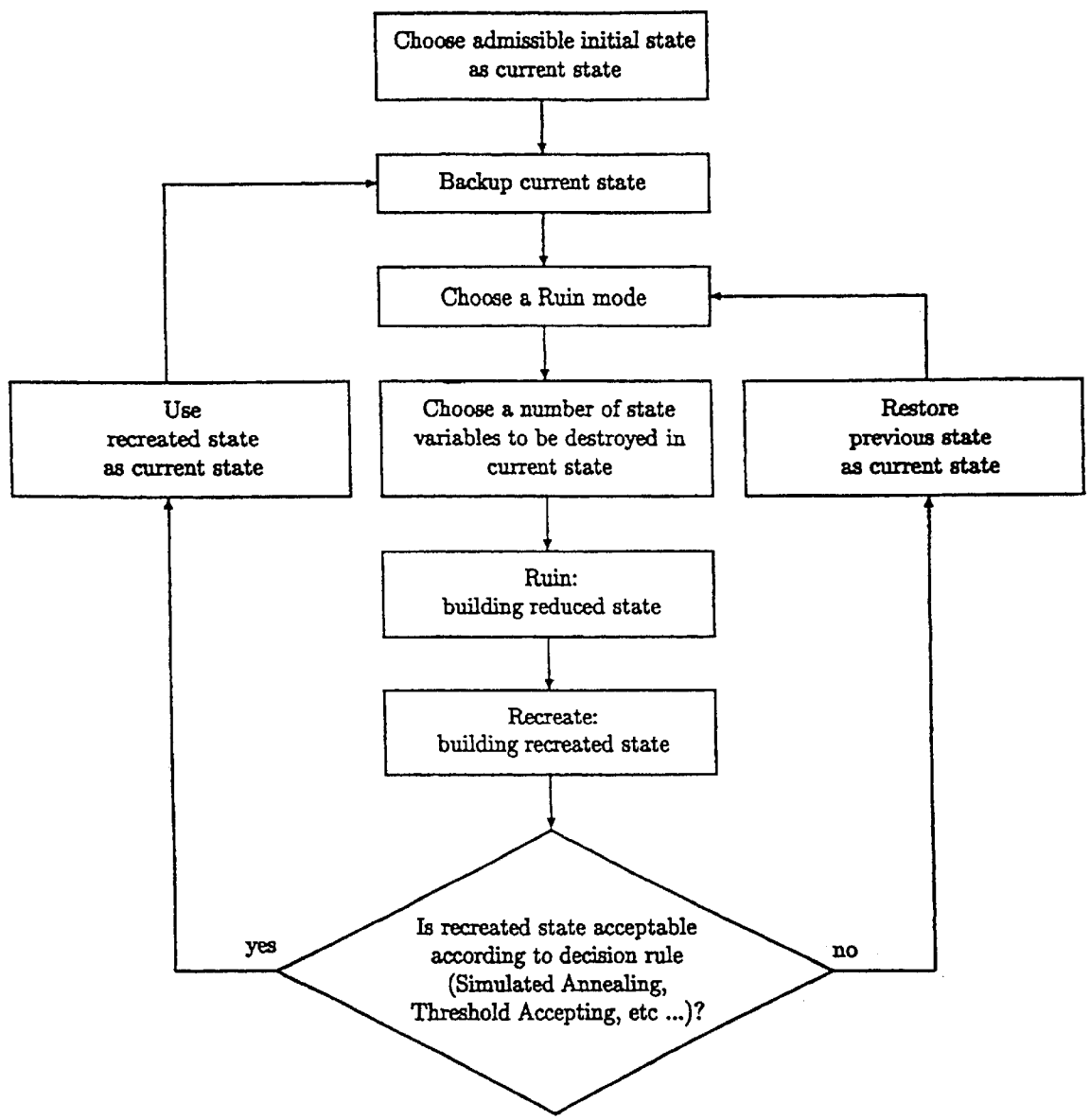
FIG. 2 is a diagram reflecting the fundamental flow of the optimization scheme according to the current invention.

Throughout this specification we exclusively use R&R radial, R&R random, R&R sequential optimization, which connect the chosen ruin mode with the best insertion technique. Of course other ruin methods and other insertion techniques could be combined without deviating from the teaching of the current invention. However the fundamental optimization scheme according to the current invention should be clear now; it comprises the following steps which are also visualized in FIG. 2:

1. Start with an initial configuration.
2. Choose a ruin mode.
3. Choose a number $A \leq [F \cdot N]$ of nodes to be removed.
4. Ruin
5. Recreate
6. Decide if you accept the new solution according to a decision rule (Simulated Annealing, Threshold Accepting, etc.). If you accept, proceed with 2), using the new solution, else restart with 2) using the current (old) solution.

4.3.5 Details of the Implementation

A route of a vehicle is represented by a sequence of customers $C_1, C_2, \ldots, C_k$. For a given route $C_1$ and $C_k$ are pseudo-customers representing the starting and ending at the central depot. The only point left unspecified in the Ruins and Recreates is the representation of time. We choose the representation as time-intervalls at each customer (including the pseudo-customers). This has the advantage, that all possible realizations in time of a given customer sequence in a route are represented simultaneously. Let $C_i^{first}$ and $C_i^{last}$ be the first and last time the customer $C_i$ allows the start of the service, and $C_i^{job}$ be its service-time (the service-time is 0 for the pseudo-customers). Now $C_i^{early}$ and $C_i^{late}$ are always updated to represent the first and last time the service may start at $C_i$ inside the actual route. A time-window conflict exists at customer $C_i$ if and only if $C_i^{early} > C_i^{late}$. The travel time between two customers $C_i$ and $C_j$ is denoted by $\text{travel}(C_i, C_j)$. If customer $C_i$ is inserted newly into the route it gets initialized by $C_i^{early} = C_i^{first}$ and $C_i^{late} = C_i^{last}$. Then the early- and late-entries are updated similarly, here demonstrated for the early-entries:

for i:=2 to k do $C_i^{early} = \max\{C_i^{early}, C_{i-1}^{early} + C_{i-1}^{job} + \text{travel}(C_{i-1}, C_i)\}$ After removal of a customer (due to an R&R ruin) resulting in the route $C_1, C_2, \ldots, C_k$ the early-part of the update is done by:

for i:=2 to k do $C_i^{early} = \max\{C_i^{first}, C_{i-1}^{early} + C_{i-1}^{job} + \text{travel}(C_{i-1}, C_i)\}$ The late-part of the update is done similarly.

For problems where it is not easy to achieve the desired number $n_T$ of tours in a solution known as optimum/best from the literature we used the following modification of the normal approach: For each vehicle used in a configuration exceeding $n_T$ we scaled its costs by a factor of 5. For the configurations with at most "$_T$ vehicles used this does not change anything, and for others this will lead the search into the right direction. All runs were performed using Threshold Accepting as decision rule. The initial threshold $T_0$ was set to be half of the standard deviation of the objective function during a random walk. We used an exponential cooling schedule for the threshold T of the form $$T=T_0 \cdot \exp(-\ln 2 \cdot x|\beta)$$

where the half life $\beta$ was set to 0.1. The schedule variable x is increased from 0 to 1 during the optimization run. We applied a 1:1 mixture of R&R radial and R&R random, using F=0.3 and F=0.5 respectively. The single computations were performed with 40000 mutations, consuming approximately 30 minutes of CPU-time on a RS 6000 workstation, model 43P, 233 MHz. The neglection of time windows increases the computation speed approximately by a factor of three.

An important point to mention is the applicability of the R&R approach to very large vehicle routing problems. This is due to the fact that inherently it is suitable for parallel execution. Most time consuming is the calculation of the cost of acceptance for a customer by a vehicle, especially for the recreate-steps. The recreate-step consumes about 90% of the whole computing time. These calculations can easily be parallelized on the vehicle basis, since the single vehicle calculations do not interdepend. This is even valid for the single tests on different potential positions inside a vehicle tour. For example in vehicle routing systems the recreate operations have to query all transportation facilities for recalculation of state variables; as "independent objects" said transportation facilities can be queried in parallel.

4.3.6 Results

The work on VRPTW can be split into two groups: work on exact algorithms or heuristics and work on meta-heuristics. The results prior to Rochat et al. fall into the first category, the work of Rochat et al. itself into the second one. R&R is a strategy to solve complex combinatorial problems. The application of R&R to VRPTW is a heuristic and therefore fall into the first category.

We compare our results to the work prior to Rochat et al. in FIG. 3 (left), FIG. 4 (left) and to the work of Rochat et al. in FIG. 3 (right), FIG. 4 (right). In FIG. 3 (left), FIG. 4 (left) there are 8 cases, where our results are worse, 12 cases where our results are equal and 36 cases where we found better solutions. There are only 3 cases where we missed the minimum number of tours, but 5 where we are one tour better than the best known result. Comparison of the results with the work of Rochat et al. shows, that in 24 cases we received the same results and have better results in 31 cases. Only 1 problem was solved better by Rochat et al. Besides two exceptions, where our solutions are one tour better, we always received solutions with the same number of tours. The great number of equal results was possible since we both used doubly precision real arithmetic and indicate, that perhaps many of these 24 problems may not be improved at all. The problems from groups C1 and C2 are solved by most authors and us with nearly the same quality and for 5 out of the 9 problems from C1 optimally. Thus we consider these problem sets as "easy". For each of the other groups we present the best improvement for a problem we found in FIG. 5.

The aim of an optimization algorithm can be to achieve a new best solutions (sports) or to be used in practice. In the second case a small variance of the (good) results is even more important than the average quality or the best solution that can be found by an algorithm. FIG. 6 shows the statistics of 50 runs for each of the above mentioned 4 problems. The value $\rho$ is the probability of the event, that a solution consists of the best known number of tours. It differs widely for these problems. For the first 3 problems even the worst solutions found were better than the previous optimum solution. For problem RC206 all runs resulted in solutions with the best known number of tours used. Here the worst solution is worse than the best known, but even the mean value of these solutions is better than the actual best known.

4.4 R&R for Network Optimization 4.4.1 The Problem

In this section we introduce the really hard problem of network optimization. Attempting to get reasonably good solutions for IBM customers we realized that the simple annealing and threshold accepting methods were not satisfactory or failed, if you prefer this harder formulation. The landscape of this harder problem seems to be extremely "discontinuous". At this point, frustrated with the results of classical algorithms, we developed the final Ruin&Recreate idea. We state the problem. In a Wide Area Network (WAN) you have the task to transmit certain amounts of information over an undirected graph, the network. Different nodes are connected by so-called links. Each link consists of zero or more communication lines, so-called trunks, each having a bandwidth, which is measured in bits per second (bps), kilobits per second (Kbps) or megabits per second (Mbps). If you want to communicate from point a to point b in a network, you can subscribe for a trunk with a sufficient bandwidth. Your ISDN channel, for instance, is such a trunk and has 64 (Kbps. Your provider may offer trunks with different bandwidths. In Germany, for instance, you can get 9.6, 19.2, 64, 128 Kbps trunks, or even 2 and 34 Mbps trunks. Depending on the length of the trunk and of its bandwidth you have to pay a fee per time unit, typically per month. The prices are non-linear in length and bandwidth. Usually, there is a basic fee that you can communicate at all, shorter trunks are much more expensive per mile than longer ones where you get a discount in length etc. Since there are many recently founded new telecommunication providers, there is no hope anymore for simple price structures.

Suppose you have an enterprise with six offices in a country as shown in FIG. 7. From c to b, from d to c, from f to d, from f to a, from e to a you need a communication bandwidth of 10 Mbps to satisfy your communication demands. The left hand picture of FIG. 7 is then called your demand graph; the various demands in that network have been graphically presented by paths of different line structures. You could now order the trunks exactly corresponding to this demand graph to build your communication network. That solves your task immediately. However, it's easy to argue that there might be cheaper ways to link your offices. See the right hand picture in FIG. 7; the routing solution of the demands in that network is graphically presented by paths of different line structures in which the type of line structure corresponds to the demand graph. If we order these trunks from the telecom, the total trunk length is reduced from 885 units in the straight forward solution to 562 units. If we communicate from c to b in this new network, our messages will be routed over f, like we will say. We say, from c to b over f, our message is routed with two hop counts. Location f has to be provided with switching technology.

Network optimization is the mathematical problem to find the cheapest possible communication network for your demand graph. In the following we state the problem a bit more precise and state some necessary conditions on solutions. It is convenient to state the demands as a matrix rather than to visualize them in a graph. For instance, the example problem in FIG. 7 has the demand matrix $$D = \begin{pmatrix} \cdots & \cdots & \cdots & \cdots & \cdots & \cdots \\ 0 & \cdots & \cdots & \cdots & \cdots & \cdots \\ 0 & 10 & \cdots & \cdots & \cdots & \cdots \\ 0 & 0 & 10 & \cdots & \cdots & \cdots \\ 10 & 0 & 0 & 0 & \cdots & \cdots \\ 10 & 0 & 0 & 10 & 0 & \cdots \end{pmatrix}$$

The maximum hop counts may be restricted for every single demand, because, for example, telephone paths are routed better over less or equal than two hop counts because of possible echo effects. This is due the delay caused by intermediate nodes. In such a case the hop count matrix H may look like $$H = \begin{pmatrix} \cdots & \cdots & \cdots & \cdots & \cdots & \cdots \\ 0 & \cdots & \cdots & \cdots & \cdots & \cdots \\ 0 & 2 & \cdots & \cdots & \cdots & \cdots \\ 0 & 0 & 2 & \cdots & \cdots & \cdots \\ 2 & 0 & 0 & 0 & \cdots & \cdots \\ 2 & 0 & 0 & 2 & 0 & \cdots \end{pmatrix}$$

For every site of the network, we know if it may possess switching functionality or not. The vector $S=(1,1,1,1,1,1)$ indicates for our small example., that every site has a switching functionality (no switching functionality is denoted by 0).

For a network optimization problem we have to know further the vector P of coordinates of the geographical locations of the sites and the set of possible trunk bandwidths. In our example, the positions are given by $P=((160, 60), (0,50), (220,210), (70,0), (10,180), (80,80))$ and only trunks with bandwidth of 34 Mbps may be used. The price or cost of a single 34 Mbps trunk is equal to its length, e. g. the euclidean distance between a pair of sites. In practice, the price for a trunk with a specified bandwidth depends on the distance in a more complex form. FIG. 7 (right) shows the optimum network for this problem. Topologically it consists of a so-called star of five links, each link containing a single 34 Mbps trunk. The numbers at the links in FIG. 7 denote the actual bandwidth needed. The routing solution of the demands in that network is graphically presented by paths of different line structures in which the type of line structure corresponds to the demand graph. The routing matrix is given by $$R = \begin{pmatrix} \cdots & \cdots & \cdots & \cdots & \cdots & \cdots \\ \epsilon & \cdots & \cdots & \cdots & \cdots & \cdots \\ \epsilon & cfb & \cdots & \cdots & \cdots & \cdots \\ \epsilon & \epsilon & dfc & \cdots & \cdots & \cdots \\ efa & \epsilon & \epsilon & \epsilon & \cdots & \cdots \\ fa & \epsilon & \epsilon & fd & \epsilon & \cdots \end{pmatrix}$$

with $\epsilon$ denoting the empty path. By looking at a simple example we have defined the network optimization problem. In summary the parameters of the Network Optimization Problem are:

Input:

a number of sites and their geographical coordinates switching facilities at the sites demand matrix with demand entries from site to site hop count matrix with hop count restrictions for each demand a set of trunk types (bandwidths) that can be ordered pricing table depending on bandwidth and distance Output:

graph of links consisting of certain trunks that meets all demands and restrictions routing matrix with route entries for every demand Objective function: minimal price. for an admissible network That's the mathematical problem. In practice, our customers don't like very "abstractly looking" or "mathematically looking" solutions which don't look "intuitive". So we have to rearrange the solutions a little bit. In addition, many alternatives are compared with different switching facilities to save network equipment.

Another serious property which is very often requested in practice is redundancy. Treating redundancy in network optimization is the consideration of possible failures of network components (trunks and machines). One would like to be able to run networks even in case of such failures. Therefore, many. networks are built with one of the two following properties:

for every demand there are defined two alternative routings which do not have any link in common for every demand there are defined two alternative routings which do not have any intermediate knot in commmon Networks with this features are called link redundant or knot redundant, respectively, if the following conditions are satisfied: If a link or knot fails and if in this case all affected routings of demands are changed to their alternative routing, then this new,routing is an admissible solution for the original network problem. Note that knot redundancy implies link redundancy, so that knot redundancy is the harder restriction. In normal networks we have a trunk availability of more than 99%. Failure is therefore a rare case in terms of time (not in subjective anger, of course). In these few intermediate failure times it is certainly tolerable to use alternative routings with larger hop counts. For redundancy optimized networks the problem has, for this reason, a hop count matrix $H^{ord}$ and $H^{alt}$ for the ordinary case and for the case of single failure, respectively. In our mini-example we use $$H^{ord} = H = \begin{pmatrix} \cdots & \cdots & \cdots & \cdots & \cdots & \cdots \\ 0 & \cdots & \cdots & \cdots & \cdots & \cdots \\ 0 & 2 & \cdots & \cdots & \cdots & \cdots \\ 0 & 0 & 2 & \cdots & \cdots & \cdots \\ 2 & 0 & 0 & 0 & \cdots & \cdots \\ 2 & 0 & 0 & 2 & 0 & \cdots \end{pmatrix}$$

-continued $$H^{alt} = \begin{pmatrix} \cdots & \cdots & \cdots & \cdots & \cdots & \cdots \\ 0 & \cdots & \cdots & \cdots & \cdots & \cdots \\ 0 & 3 & \cdots & \cdots & \cdots & \cdots \\ 0 & 0 & 3 & \cdots & \cdots & \cdots \\ 3 & 0 & 0 & 0 & \cdots & \cdots \\ 3 & 0 & 0 & 3 & 0 & \cdots \end{pmatrix}$$

Nowadays network optimization tools approach the problem in two steps. First, a good basic network is designed. Then all the links necessary to achieve redundancy are added in a clever way. FIG. 8 (left) shows the best solution we obtained for this kind of approach. The upper left part of FIG. 8 visualizes the resulting topology of connections with their required bandwidths. The left part in the middle of FIG. 8 reflects the ordinary solution for the various demands. The lower left part of FIG. 8 visualizes the redundancy solution of the various demands. Again the solutions of the various demands are graphically presented within FIG. 8 (left) by paths of different line structures. To the "star-like" solution for the basic network we added redundancy ending with a total length 1048 design. When we optimize the network just all-in-one, in a one-step approach we can achieve a much better solution of length 861 for this small example, which means a 21.7% improvement. The routing of FIG. 8 (right) is given by the matrices $$R^{act} = \begin{pmatrix} \cdots & \cdots & \cdots & \cdots & \cdots & \cdots \\ \epsilon & \cdots & \cdots & \cdots & \cdots & \cdots \\ \epsilon & c-e-b & \cdots & \cdots & \cdots & \cdots \\ \epsilon & \epsilon & d-a-c & \cdots & \cdots & \cdots \\ e-c-a & \epsilon & \epsilon & \epsilon & \cdots & \cdots \\ f-a & \epsilon & \epsilon & f-a-d & \epsilon & \cdots \end{pmatrix}$$

$$R^{red} = \begin{pmatrix} \cdots & \cdots & \cdots & \cdots & \cdots & \cdots \\ \epsilon & \cdots & \cdots & \cdots & \cdots & \cdots \\ \epsilon & c-a-d-b & \cdots & \cdots & \cdots & \cdots \\ \epsilon & \epsilon & d-b-e-c & \cdots & \cdots & \cdots \\ e-b-d-a & \epsilon & \epsilon & \epsilon & \cdots & \cdots \\ f-d-a & \epsilon & \epsilon & f-a-d & \epsilon & \cdots \end{pmatrix}$$

with e denoting an empty path. The upper right part of FIG. 8 visualizes the resulting topology of connections with their required bandwidths. The right part in the middle of FIG. 8 reflects the ordinary solution for the various demands. The lower right part of FIG. 8 visualizes the redundancy solution (redundant routes of the demands) of the various demands. Again the solutions of the various demands are graphically presented within FIG. 8 (right) by paths of different line structures. The numbers at the links give the actual bandwidth used. Note that every demand in our example is 10 Mbps and look at FIG. 8 (right). From d to a, there are now five different routings, each with a demand of 10 Mbps, over a single 34 Mbps line. This doesn't seem admissible at first sight. Let us give a clarifying argument. For example, the routing satisfying the demand between (b, c) and the routing satisfying the demand between (d, f) don't have a link or an intermediate node in common. Thus, if there is a single network failure, the routing satisfying the demand between (b, c) via (b, d, a, c) and the routing satisfying the demand between (d, f) via (d, a, f) will never be used simultaneously. If you go carefully through these arguments you see that the solution is in fact feasible. In addition, you see that the simple mini-network we present here for an introduction already an intriguing and intricate network optimization problem if redundancy is considered. Thus in summary the additional parameters of the Network Optimization Problem with Redundancy are:

Additional Input:
  kind of redundancy (knot or link)
  hop count constraints for alternative routings
Additional Output:
  routing matrix with failure case alternative routes for every demand 4.4.2 Starting Solution with the Ruin&Recreate The construction of a feasible solution is easy, because you obviously always can construct a very expensive solution which satisfies all constraints mentioned before.

4.4.3 Ruin

Ruin means that certain demands are removed from the system. This involves downsizing those links in bandwidth that are used by the active and redundant path of each demand having been removed.

4.4.4 Recreate

Normal "best insertion" should be clear. A demand to be inserted is chosen. Its active path inserted in the cheapest possible way, then its redundant path is added in a cost-optimal manner.

4.4.5 Details of the Implementation

How to reinsert the active and redundant path of a demand into the design is being decided by length restricted cheapest path algorithms. We obtain the length restriction by the active and redundant hop count restriction of a demand. The edge costs for the cheapest path graph algorithm are defined to be the additional costs of transport of the demand's bandwidth. Therefore the edge cost determination incorporates the following two problems.

4.4.5.1 Bandwidth Calculation

For the NRND (Non-Redundant Network Design) problem the determination of the bandwidth for a given link sufficient for dealing with its actual design bandwidth and the bandwidth of the demand to be reinserted is an easy task: just add both values. The problem becomes. more difficult in case of the RND. (Redundant Network Design) problem as already seen in the discussion of the bandwidth of link a-d in the previous example. Here a conflict graph is determined with vertices for each demand's redundant path and edges between two vertices, if the corresponding redundant path's may be needed at the same time due to some network failure, i.e. the corresponding active path's share a link (or an internal location in case of knot-redundancy). The task now is to determine groups of isolated vertices, such that the sum of the maximum demand of each group is minimal. The maximum bandwidth of such a group is sufficient for the whole group, since by the groups definition at most one of its bandwidths is needed due to network failure at the same time. Since in case of no network failure all active demands have to be guaranteed, the sum of a links active demands needs to be allocated to cover the active paths over a link. Since there is no interaction of the active paths and the redundant paths over the same link, the bandwidth necessary for a link L with set of active demands $L_{act}$ and redundant demands $L_{red}$ is given by:

$$B = \sum \{d|d \in L_{act}\} + \min_{\substack{J_i \text{ conflict free} \\ L_{red}=J_1 \cup \ldots \cup J_k}} \sum \left\{ \max_{d \in J_i} \middle| 1 \leq i \leq k \right\}$$

The problem of determining the partition of the demands above is an NP-complete by itself: if all redundant demands are the same it is the Minimum-Clique-Cover problem on the complementary graph of the conflict graph. We therefore use a First Fit Decreasing like heuristic to deal with bandwidth calculation efficiently. Exact algorithms are out of scope since there are cases with often more than 30 redundant paths over a certain network link and the calculation must be done very quick.

4.4.5.2 Trunk Set Cost Determination

Typical telecommunication providers have tariffs depending on a mixture of link distance, tariff zones and bandwidths to be transported. We used a (memory based!) tariff database to deal with the efficient answering of questions of the following type: for a given bandwidth B, a distance between two locations dist and a tariff zone Z, what is the cheapest arrangement of trunks satisfying the needs and how much does it cost? Since these calculations should take only a very little part of computing time (we want to optimize), we use a hashing approach to guarantee, that each call to the database is calculated the first time only. The actual calculation is the answering of the following (NP-complete) problem:

Problem: Minimum Weighted Cover

Instance: A set of trunks $T=\{(v_1,c_1),\ldots,(v_k,c_k)\}, v_i,c_j \in N^0$, $1 \leq i,j \leq k$, each being a volume/cost pair and a volume $V \in N^0$.

Question: Find a set $1 \subset T$ with $\Sigma_{(v,c) \in I} v \geq V$ ad $\Sigma_{(v,c) \in I} c$ minimal.

Normally the number of different trunks is not small since each different CIR (committed information rate) of a trunk with a certain bandwidth (for links with service included) gives different pairs to the above problem. The actual calculation is done with an efficient Branch and Bound Algorithm making it possible to answer exactly e.g. all 650.000.000 calls to the database during a 12 hour optimization run with a total of 1 minute CPU-time.

4.4.6 A Real Life Example

In this section we give a real-life network example tested by the proposed method. The example N15 we propose consists of 15 nodes, one of them is acting as a "center". There is no "everyone-to-everyone" communication in this network but only an "everyone-to-the-center" communication. This is a very typical case in reality. Branch offices of insurances or banks communicate with the center and usually not among each other. N15 describes such a real life case. In our optimization service for our customers we are frequently asked what the synergy effects might be if networks are managed jointly. Say, three banks with centers. near by (in a large city) are connected to their branch offices in the surrounding region. If they manage their three networks separately it will cost them some amount x for the sum of the cost of their networks. Suppose they decide to operate a joint network. Then, of course, the resulting network can be designed cheaper than the sum of their original costs. If the joint network as y% cheaper than the original sum, we say the synergy is y%. We present here such a synergy problem. From N15 we constructed two equivalent networks by translating the original network by a vector. This way we have two equivalent copies of the original N15. Consider now the new network of 45 nodes which is generated by three N15 copies. This new "synergy problem" we call N45. The task is: Optimize N15 alone, and try to compute the best synergy network N45. What is the resulting synergy?

In the sequel we provide the problem description.
Problem description of system N15:
Input:
15 locations, 11 locations with switching facilities
one demand (32–96 Kbps) from each location to the "computing center" (a single destination)
knot redundancy for all demands
maximum hop count of 3 for active and redundant path
trunk bandwidths of 64 Kbps, 128 Kbps, and 2 Mbps can be ordered
costs are 1, 2, and 3 units per length unit, respectively
distance between two nodes is euclidian (rounded)
details of the configuration of system N15 and the optimization results are given in FIG. 9.
Listed are the coordinates x and y of the single nodes, the switch facility S, its bandwidth need D (in Kbps) to the computing center C, and the optimized routings $r_{ord}$ and $r_{alt}$ for the normal case and for the failure case, respectively.

Output:
graph of links consisting of certain trunks. FIG. 10 reflects the 24 links used in the optimized system N15. Listed for each link is the accumulated bandwidth $b_{ord}$ due to the normal routings $r_{ord}$, the accumulated bandwidth $b_{alt}$ due to the routings in case of failure $r_{alt}$, the bandwidth $b_t$ of the trunk needed, and its cost. All bandwidth are given in Kbps.
outing matrix with route entries for every demand (refer to FIG. 9)

Objective function: minimum sum of trunk costs found is 11437 units

Problem description of system N45:
Input:
45 locations, 33 locations with switching facilities
consisting of three N15 subsystems with translation vectors of (0,0), (0,200), and (−200,0).
details of the configuration of system N45 and the optimization results are given in FIG. 11. Listed are the coordinates x and y of the single nodes, the switch facility S, its bandwidth need D (in Kbps) to the computing center C, and the optimized routings $r_{ord}$ and $r_{alt}$ for the normal case and for the failure case, respectively.

Output:
graph of links consisting of certain trunks. FIG. 12 reflects the 79 links used in the optimized system N45. Listed for each link is the accumulated bandwidth $b_{ord}$ due to the normal routings $r_{ord}$, the accumulated bandwidth $b_{alt}$ due to the routings in case of failure $r_{alt}$, the bandwidth $b_t$ of the trunk needed, and its cost. All bandwidth are given in Kbps.
routing matrix with route entries for every demand (refer to FIG. 11).

Objective function:
minimum sum of trunk costs found is 25304 units
synergy, compared to three isolated N15 systems, is 26.3%

4.5 Systematic Studies on the TSP

In this section we present R&R for the Traveling Salesman Problem PCB442, based on single configurations, such that decision rules as SA, TA, Greedy Acceptance and even Random Walk are applicable to guide the search in the configuration space. We will provide results for all important parts of an optimization run using the R&R method. We will shortly compare these results with well-known results for local search optimization using Lin-2-opt as mutation.

4.5.1 Initial Solutions

Usually, a random solution serves as starting point for an optimization run with local search using "non-intelligent" mutations of small order. This choice is most reasonable because it corresponds to a typical solution produced by non-intelligent mutations in a Random Walk. However, this may not be an appropriate choice for the R&R mutations, which have a kind of artificial intelligence due to the recreate part, which works according to the best-insertion rules (though other insertion techniques could be used instead). Therefore we want to propose not to use a randomly built solution but one which is completely constructed with the best-insertion heuristics. Therefore, at the beginning we ruin the whole system and recreate it.

From now on we note the mean cost by <C>, the error bar by $\Delta C = \sigma(C)/\sqrt{M-1}$ with $\sigma(C)$ the standard deviation of C and M the number of measurements, $C_{min}$ the smallest cost found, and $C_{max}$ the largest cost found.

We oppose the distribution and the quality of the two different starting points for the PCB442 problem, which has an optimum length of 50783.5. FIG. 13 shows the distribution of the lengths received both for 100000 randomly created solutions and for 100000 solutions generated with the best-insertion heuristics for the PCB442 problem. Left border: minimum at 50783.5; Right border: maximum tour length is approximately 1130000. We see that the distributions for randomly created solutions and configurations constructed with best-insertion are both nearly log-gaussian but differ in the width of the gaussian bell and in the height and position of the peak. The distribution generated by the best-insertion heuristics is much smaller and has therefore a higher peak, furthermore, its peak is not far away from the optimum. The mean length of randomly generated solutions is close to the exact value $$\frac{1}{N-1}\sum_{ij=1}^{N}d_{ij},$$

as expected, but the results for the best-insertion heuristics are only about 15% worse than the optimum:

| initialization method | <C> | ΔC | $C_{min}$ | $C_{max}$ |
|---|---|---|---|---|
| random solution | 772647 | 48.6 | 687028 | 837615 |
| best-insertion | 58143 | 2.5 | 54710 | 61766 |

Therefore,. here one detects the first advantage of our new method: one starts already much nearer to the optimum by this "R&R all" than with a random solution, continues with R&R mutations, which do not worsen a configuration much because of the best-insertion rule, such that the system stays right from start in the near of the optimum until the end of the optimization run. We save automatically the calculation time an optimization run with small mutations would need to descend from the range of the random solutions, which lie about a few 100% above the optimum, to the range of "x+15%" and can concentrate on reducing these "15%".

4.5.2 The Optimization Run

Usually a Monte Carlo Optimization Run using the meta-heuristics SA, TA, or GDA starts with a Random Walk and ends in the Greedy Acceptance mode. Here we want to discuss the behaviour of the R&R mutations especially for these marginal decision rules. Finally we present results especially for the TA.

4.5.3 Random Walk

It can be easily seen from mutations of small order without any intelligence, like e.g. the lin-n-opts, which choose new edges at random, that a random walk with such mutations produces solutions which can be as well achieved by a random generation. Therefore small mutations produce the distribution of random solutions in a random walk, the same distribution as shown in FIG. 13. However, we have to ask whether the R&R mutations with A<N change the distribution of the lengths of the solutions generated by "R&R all"-mutations with A=N.

We show in FIG. 14 the distributions after constructing a solution with the best-insertion heuristics and then performing 100 mutations in a Random Walk, either with radial, random, or sequential ruin, for different ratios of F (representing the fraction according to $A \leq [F \cdot N]$). We find that the distributions are changed, for small F the solutions are improved, which is quite clear because of our best-insertion strategy the system shows a Greedy Acceptance-like behaviour. For large F we get different results for the 3 mutations: R&R random provides the best results for larger F, R&R radial does not change the distribution much, and R&R sequential worsens the solutions. These results can easily be explained: R&R random can best make use of the rest tour since the nodes which were taken away are uniformly distributed over the whole system, such that a good framework of the whole system remains for reinsertion of the nodes. R&R radial constructs a part of the system completely new in a certain disc with only a few clues in the surrounding of the limiting circle. The ruin part of R&R sequential, however, produces a long edge in the system, the nodes are often inserted in other edges such that after the mutation mostly a long edge in the system remains. Therefore, this mutation provides a demonstrative example for a bad combination of a ruin and a recreate. (Note that we do not generally speak of a bad sequential ruin, only the combination does not provide good results, e.g. the combination of a sequential ruin and a recreate, which inserts the removed nodes only between the two limiting nodes of the long edge, may provide better results.)

4.5.4 Greedy Acceptance

For comparison we provide now analog results for these mutations combined with Greedy Acceptance. In FIG. 15 we find differences to the results above.

First of all we find that nearly all results using Greedy Acceptance have a better quality than using Random Walk (RW). The largest differences are obtained if using radial or sequential ruin, whereas the gain is very small if using random ruin. The results do not differ much for small F because for such small fractions it is nearly the same using the Greedy Acceptance or the Random Walk: if we take only one node away and perform a best insert then we get either the same or a better configuration, Greedy Acceptance and Random Walk coincide. If we take a few nodes only very small deteriorations can happen. Secondly, the distributions of the results obtained with Greedy Acceptance get a sharper peak for larger F; the peak is transferred to smaller lengths. However, using F=0.5 produces worse results than F=0.2 if working with sequential or radial ruins. The optimum fraction F depends on the kind of the ruin, and is close to 0.2 for radial destructions.

4.5.5 comparison: Random Walk/Greedy Acceptance

However, till now we have only seen a trend for the different mutations, the journey to other values of the objective function has not ended at all after 100 mutations both for RW and for GRE, as we see in FIG. 16. FIG. 16 shows the averaged length as a function of the number of the R&R mutations, starting from an R&R all configuration for choosing radial, random, and sequential ruin with different fractions F; left: for Random Walk; right: for Greedy Acceptance.

Using the Random Walk we find that for larger F the ensemble mean of 10 independent runs cannot further be improved after roughly 1000 mutations if working with radial or sequential ruin; the runs with a small F show nearly the same behaviour as their counterparts working with Greedy Acceptance. Using the random ruin we get a completely different behaviour, analogously to FIG. 14: the mean value still decreases till the end, for all values of F. Working with Greedy Acceptance we find at first sight that all curves decrease sigmoidally. The best results are gotten using large maximum F because these mutations are able to reorder the system on a larger scale and therefore to find better improvements. Again radial and sequential ruin are more similar to each other than to random ruin.

4.5.6 Threshold Accepting

Although we have seen that we do not need complicated decision rules, since the R&R strategy is able to achieve good solutions already using Greedy Acceptance, we now want to provide results for combining R&R with TA. FIG. 17 (left) displays the development of the quality of the solutions, $$q = 100 \cdot \frac{\langle C \rangle - C_{opt}}{C_{opt}}$$

as a function of the cpu-time for 6 different cooling schedules, both, for the Lin-2-opt mutations and for the R&R mutations, with the average taken over 20 runs. One second of cpu-time corresponds to 100 R&R mutations with (F=0.2) and to 300000 Lin-2-opt mutations. The following cooling schedules for the threshold T were used (denoted with a continuous schedule variable x increased from 0 to 1, which is equal to the ratio of the number of the current step to the total number of cooling steps):

Linear Decay:

$$T = T_0 \cdot (1-x)$$

Exponential Decay:

$$T = T_0 \cdot \exp(-\ln 2 \cdot x/a)$$

with half lives $\alpha$=0.2, 0.4, 0.6 and 0.8
Greedy:

$$T = 0$$

At the end each optimization run was terminated by an x-range [1.0:1.1] with Greedy Acceptance to assure to reach a local optimum. The initial threshold $T_0$ for the cooling schedules is determined by the standard deviation of an initial random walk of 1000 steps. Using R&R mutations with a 1:1 mixture of random ruins and radial ruins with the best found fraction F=0.2 we got $T_0$=230, instead working with the Lin-2-opt only we get $T_0$=980. However we took $T_0$=130, which gives much better results in the Lin-2-opt case.

FIG. 17 (left) shows the time development of the quality q, averaged over 50 runs, using R&R and Lin-2-opt with different cooling schedules. Total cpu-time for each run is 16 seconds. FIG. 17 (right) shows the optimization results, averaged over 50 runs, as a function of the total simulation time. The error bars denote the standard deviations; lower curve: for R&R with linear cooling; upper curve: for Lin-2-opt with exponential cooling ($\alpha$=0.4). Additionally the average results for R&R with Greedy Acceptance are marked by "+". Several times the optimum value of 50783.5 was reached using R&R with TA.

FIG. 17 (left) shows that the results for R&R are highly independent of the schedule applied. However, TA can improve the optimization result. On the other hand, the quality of the results is more sensitive to the schedule if working with the Lin-2-opt, especially if using Greedy Acceptance; here linear cooling and exponential cooling with a decay of $\alpha$=0.4 provide rather good results.

In the right picture of FIG. 17 we provide results using the "optimum" value of $\alpha a$=0.4 and comparing it with results for the Greedy Acceptance. We find that in all cases the R&R mutations are superior to the common Lin-2-Opt, using TA we get further improvements of the results also if working with R&R.

4.6 Computational Aspects

An important point to mention is the applicability of the R&R approach to very large vehicle routing problems. This is due to the fact that inherently it is suitable for parallel execution. Most time consuming is the calculation of the cost of acceptance for a customer by a vehicle, especially for the recreate-steps. The recreate-step consumes about 90% of the whole computing time. These calculations can easily be parallelized on the vehicle basis, since the single vehicle calculations do not interdepend. This is even valid for the single tests on different potential positions inside a vehicle tour. For example in vehicle routing systems the recreate operations have to query all transportation facilities for recalculation of state variables; as "independent objects" said transportation facilities can be queried in parallel.

What is claimed is:

1. A method for automatic, computer-based optimization of a technical system said technical system being described by a state $\vec{x}$ with state-variables $x_\nu$, $\nu$=1, . . . , N, and said technical system rated in a state $\vec{x}$ by a measure $f(\vec{x})$, and said method determining an improved state $\vec{x}_{opt}$ with an improved measure $f(\vec{x}_{opt})$ and said improved state satisfying one or more additional constraints and said method comprising the following steps:

an initialization-step as step 1, choosing a first state as current-state $\vec{y}$ of said technical system said first state already satisfying said additional constraints, and a ruin-step as step 2, destroying said current-state by selecting a subset B of said current-state's state-variables $y_{\nu_\mu}$, $\mu$=1, . . . , M, and excluding them from the current-state building a reduced-state, and a recreation-step as step 3, determining a recreated-state $\vec{Z}$ said recreated-state being determined by extending said reduced-state by substitute-state-variables $Z_{\nu_\mu}$, substituting said excluded-state-variables of said subset B, and said recreated-state satisfying said additional constraints, and determination of said substitute-state-variables is not guided by the values of said excluded-state-variables, and an acceptance-step as step 4, deciding if said recreated-state is to be accepted as a new current-state $\vec{y}$, and an iteration-step as step 5, deciding to iterate said method beginning with step 2.

2. The method according to claim 1,
wherein said recreation-step determines said substitute-state-variables by construction heuristics and/or exact algorithms.

3. The method according to claim 2,
wherein said recreation-step,
  comprises a substep 3A of selecting at least one of said excluded-state-variables, and
  comprises a substep 3B of calculating and assigning said selected-state-variable a value, and
  repeating said substeps 3A and 3B until all substitute-state-variables have been determined.

4. The method according to claim 3, wherein said recreation-step comprises a best-insertion-step, comprising a substep 3B of calculating and assigning said selected-state-variable a value optimizing said measure f( ) of said reduced-state extended by said substitute-state-variable with respect to said selected-state-variable.

5. The method according to claim 1,
wherein said state-variables comprises specifications of a multitude of $N_{Nodes}$ nodes, and
wherein a neighbourhood-relationship is defining distances between pairs of nodes, and
wherein said ruin-step comprises a radial-ruin-step,
  wherein a first node and its related state-variables are selected and excluded from said current-state $\vec{y}$, and
  wherein a random number $A \leq N_{Nodes}$ is determined and the A nearest nodes of said first node according to said neighbourhood-relationship are selected and the related state-variables of said A nearest nodes are excluded from said current-state $\vec{y}$, and/or
wherein said ruin-step comprising a random-ruin-step,
  wherein a random number $A \leq N_{Nodes}$ is determined and A nodes are selected randomly and their state-variables are excluded from said current-state $\vec{y}$.

6. The method according claim 1,
wherein said state-variable comprises specifications of a multitude of $N_{Nodes}$ nodes, and
wherein said state-variables comprises specifications of sequences of said nodes, and
wherein said ruin-step, comprises a sequential-ruin-step,
  wherein a first node and its related state-variables are selected and excluded from said current-state $\vec{y}$, and
  wherein a random number $A \leq N_{Nodes}$ is determined and the A-1 preceding or succeeding nodes of said first node are selected and their related state-variables are excluded from said current-state $\vec{y}$, and/or
wherein said ruin-step comprises a random-ruin-step,
  wherein a random number $A \leq N_{Nodes}$ is determined and A nodes are selected randomly and their state-variables are excluded from said current-state $\vec{y}$.

7. The method according to claim 1,
wherein said technical system and said related state-variables describe a routing-system with a multitude of transfer-facilities serving a multitude of locations and said locations requesting transfer-demands between pairs of said locations and said measure being the transfer-costs, and
wherein said ruin-step comprising a demand-ruin-step,
  wherein at least one transfer-demand is selected, and
  wherein all state-variables relating to said selected-transfer-demand are selected and are excluded from said current-state $\vec{y}$, and
wherein in said recreation-step in substep 3A and 3B the state-variables relating to said selected-transfer-demand are calculated.

8. The method according to claim 7,
wherein said routing-system is a transportation-routing-system, and
wherein said transfer-facilities are transportation-facilities, and
wherein said transfer-demands are transportation-demands of transportation-sizes, and
wherein said ruin-step comprises a transportation-demand-ruin-step,
  wherein a range of transportation-sizes is determined, and
  wherein state-variables relating to transportation-demands within said range of transportation-sizes are selected and are excluded from said current-state $\vec{y}$, and/or
wherein in said method according to a time-window-constraint a transportation-demand is to be served within a time-window-interval, and/or
wherein said ruin-step comprises a time-window-ruin-step,
  where in a range of time-window-intervals is determined, and
  wherein all state-variables relating to demands of time-window-intervals within said range of time-window-intervals are selected and are excluded from said current-state $\vec{y}$.

9. The method according to claim 7,
wherein said routing-system describes a communication-network, and
wherein said locations are communication-nodes, and
wherein said multitude of transfer-demands are communication-demands between pairs of communication-nodes of certain band-widths to be satisfied by a sequence of trunks, said trunks representing the transfer-facilities, connecting each of said pairs of communication-nodes, and
wherein said measure the communication-costs, and
wherein said ruin-step comprises communication-demand-ruin-step,
  wherein at least one communication-demand is determined and state-variables related to the sequence of trunks connecting the pair of communication-nodes of said determined communication-demand are selected and are excluded from said current-state $\vec{y}$.

10. The method according to claim 7,
wherein said routing-system is describing a production-planning-system.

11. The method according to claim 4,
wherein said initialization-step is determining said first state by executing said best-insertion-step using a reduced-state, for which all state-variables have been excluded.

12. The method according to claim 1,
wherein said acceptance-step deciding, if said recreated-state is to be accepted as new current-state,
  is calculating for said recreated-state $\vec{Z}$ its corresponding measure $f(\vec{Z})$ and is accepting said recreated-state
   according to the random-walk-technique; and/or
   according to the greedy-acceptance-technique; and/or
   according to the simulating-annealing-technique; and/or
   according to the threshold-accepting-technique; and/or
   according to the great-deluge-technique; and/or
   according to the record-to-record-travel-technique.

* * * * *